US011022764B2

(12) United States Patent
Toba et al.

(10) Patent No.: US 11,022,764 B2
(45) Date of Patent: Jun. 1, 2021

(54) OPTICAL CONNECTOR, OPTICAL CABLE, AND ELECTRONIC DEVICE

(71) Applicant: SONY CORPORATION, Tokyo (JP)

(72) Inventors: Kazuaki Toba, Kanagawa (JP); Masanari Yamamoto, Kanagawa (JP); Ryohei Takahashi, Kanagawa (JP); Hiroshi Morita, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 104 days.

(21) Appl. No.: 16/342,001

(22) PCT Filed: Nov. 7, 2017

(86) PCT No.: PCT/JP2017/040153

§ 371 (c)(1),
(2) Date: Apr. 15, 2019

(87) PCT Pub. No.: WO2018/092643

PCT Pub. Date: May 24, 2018

(65) Prior Publication Data

US 2019/0265420 A1 Aug. 29, 2019

(30) Foreign Application Priority Data

Nov. 17, 2016 (JP) ............................ JP2016-223743

(51) Int. Cl.
*G02B 6/42* (2006.01)
*H01L 31/0232* (2014.01)
(Continued)

(52) U.S. Cl.
CPC ............ *G02B 6/4206* (2013.01); *G02B 6/32* (2013.01); *G02B 6/40* (2013.01); *G02B 6/42* (2013.01);
(Continued)

(58) Field of Classification Search
CPC .......... G02B 6/4206; G02B 6/40; G02B 6/32; G02B 6/42; G02B 6/4214; G02B 5/02;
(Continued)

(56) References Cited

U.S. PATENT DOCUMENTS 6,351,584 B1 2/2002 Horie et al.
6,457,875 B1 10/2002 Kropp et al.
(Continued)

FOREIGN PATENT DOCUMENTS

CN 1455529 A 11/2003
CN 1541341 A 10/2004
(Continued)

OTHER PUBLICATIONS

English machine translation of JP2007011060A (Year: 2007).*
(Continued)

*Primary Examiner* — John Bedtelyon
(74) *Attorney, Agent, or Firm* — Chip Law Group

(57) ABSTRACT

Laser hazard at disconnection can be prevented with a simple structure. A tubular connector exterior, and a block that is incorporated on one end side of the connector exterior and on which a light emission portion or a light incident portion is mounted toward the other end side are provided. The light emission portion or the light incident portion is mounted on the block so that the optical axis direction thereof is tilted relative to the longitudinal direction of the connector exterior. The light emission portion is a lens through which light output from a light transmission path is collimated and emitted. At least part of the collimated light emitted through the lens is incident on a light diffusion portion provided inside the connector exterior.

28 Claims, 18 Drawing Sheets

10A
111A
121A
1111A
11A
202A
122A
LA1
LA1
122A
202A
111A
1111A
121A
11A
12A

(51) Int. Cl.

| | |
|---|---|
| ***G02B 6/40*** | (2006.01) |
| ***H01S 5/022*** | (2021.01) |
| ***G02B 6/32*** | (2006.01) |
| ***G02B 5/02*** | (2006.01) |

(52) U.S. Cl.
CPC ........ *G02B 6/4214* (2013.01); *H01L 31/0232* (2013.01); *H01S 5/022* (2013.01); *G02B 5/02* (2013.01)

(58) Field of Classification Search
CPC ......... G02B 2006/4297; H01L 31/0232; H01S 5/022
See application file for complete search history.

(56) References Cited

U.S. PATENT DOCUMENTS

| | | | | |
|---|---|---|---|---|
| 7,373,050 | B2 * | 5/2008 | Nagashima ............ | G02B 6/262 385/38 |
| 2002/0039220 | A1 | 4/2002 | Ishii et al. | |
| 2003/0012513 | A1 | 1/2003 | Ukrainczyk | |
| 2003/0198444 | A1 | 10/2003 | Mine et al. | |

FOREIGN PATENT DOCUMENTS

| | | | |
|---|---|---|---|
| CN | 101821908 | A | 9/2010 |
| CN | 103094802 | A | 5/2013 |
| EP | 1018052 | A1 | 7/2000 |
| EP | 3499283 | A1 | 6/2019 |
| JP | 11-237535 | A | 8/1999 |
| JP | 2002-048948 | A | 2/2002 |
| JP | 2003-307658 | A | 10/2003 |
| JP | 2003-322770 | A | 11/2003 |
| JP | 2005-512111 | A | 4/2005 |
| JP | 2007-011060 | A | 1/2007 |
| JP | 2016-057383 | A | 4/2016 |
| KR | 10-2003-0082388 | A | 10/2003 |
| KR | 10-2004-0015330 | A | 2/2004 |
| TW | 200306711 | A | 11/2003 |
| TW | I235259 | B | 7/2005 |
| WO | 99/15927 | A1 | 4/1999 |
| WO | 03/005088 | A1 | 1/2003 |
| WO | 03/096094 | A1 | 11/2003 |

OTHER PUBLICATIONS

Office Action for CN Patent Application No. 201780069746.X dated May 20, 2020, 9 pages of Office Action and 10 pages of English Translation.

International Search Report and Written Opinion of PCT Application No. PCT/JP2017/040153, dated Jan. 9, 2018, 10 pages of ISRWO.

* cited by examiner 10B
111B
111B
121B
1111B
122B
122B
LB1
LB1
121B
1111B
11B
11B
12B
124B
124B
123B
123B
202B
202B
2022B 10A
202A
202A
12A
111B
111B
11A
11A
1111A
1111A
121A
121A
122A
122A
1111B
1111B
122B
122B
LB1
LB1
121B
121B
11B
11B
111A
111A
12B
124B
124B
10B
123B
123B
202B
202B
2022B 20A
202A'
202A'
22A
211B
211B
21A
21A
221A
221A
LB2
LB2
221B
221B
21B
21B
211A
211A
22B
202B
202B
20B 30A
202A
202A
32A
31A
31A
111B
111B
321A
321A
33A
33A
LB1
LB1
121B
121B
11B
11B
311A
311A
12B
30B
202B
202B

OPTICAL CONNECTOR, OPTICAL CABLE, AND ELECTRONIC DEVICE

CROSS REFERENCE TO RELATED APPLICATIONS

This application is a U.S. National Phase of International Patent Application No. PCT/JP2017/040153 filed on Nov. 7, 2017, which claims priority benefit of Japanese Patent Application No. JP 2016-223743 filed in the Japan Patent Office on Nov. 17, 2016. Each of the above-referenced applications is hereby incorporated herein by reference in its entirety.

TECHNICAL FIELD

The present technology relates to an optical connector, an optical cable, and an electronic device. More particularly, the present technology relates to an optical connector or the like that can avoid danger due to light leakage at removal.

BACKGROUND ART

Recently, a larger transmission capacity has been requested along with increase in the amount of communication through the Internet or the like. It has been becoming difficult to achieve such a large transmission capacity with a conventional transmission scheme through a copper cable. Accordingly, studies have been made on optical communication with which a larger transmission capacity can be achieved.

Currently, a typically used optical cable employs what is called a physical contact (PC) scheme in which optical fibers are connected with each other in a connector. However, the PC scheme needs highly accurate adjustment for positioning of both optical fibers. Furthermore, at each connection of the optical fibers, both optical fibers need to be cleaned to avoid damage on the optical fibers due to dust and the like adhering to ends of the optical fibers. Further, in the PC scheme, to prevent connection defect at the gap between the leading ends of the optical fibers, it is essential to inject a refractive index adjuster into the gap. For these reasons, it is difficult for a general user to connect and remove optical fibers by the PC scheme.

A collimated light connection scheme has been disclosed as a method of solving these problems. In the collimated light connection scheme, a lens is mounted at the leading end of each optical fiber with their optical axes aligned, and an optical signal is transferred as parallel light between the facing lenses. When the collimated light connection scheme is employed, accuracy requirement on positioning between connectors of the optical fibers is relaxed. Further, in the collimated light connection scheme, the optical fibers are optically connected with each other in a non-contact manner, and thus adverse influence on transmission quality due to dust and the like between the optical fibers can be reduced, and no frequent and careful cleaning needs to be performed.

However, parallel light used in the collimated light connection scheme is unlikely to attenuate at distance from an emission portion in principle, and cannot satisfy laser beam standards such as IEC 60825-1 and IEC 60825-2, depending on the intensity thereof. Thus, a shutter is provided to an optical connector to shield the parallel light at disconnection.

Furthermore, Patent Document 1 discloses an optical connector to prevent laser hazard due to collimated light (parallel light). Specifically, Patent Document 1 discloses an optical connector for performing collimated light connection in which an optical fiber fixing part and a collimate lens are provided with two facing recess-protrusion structures. With this optical connector, at disconnection of the optical connector, the collimate lens is separated from the optical fiber fixing part, and the recess-protrusion structures scatter light from the optical fiber. At connection of the optical connector, the collimate lens is pressed and contacts the optical fiber fixing part through the two recess-protrusion structures, and thus parallel light is emitted.

CITATION LIST

Patent Document

Patent Document 1: Japanese Patent Laid-open No. 2013-64803

SUMMARY OF THE INVENTION

Problems to be Solved by the Invention

In the optical connector disclosed in Patent Document 1, the collimate lens is pressed and contacts the optical fiber fixing part through the two recess-protrusion structures even at disconnection, and thus collimated light can be emitted from the optical connector. Furthermore, the optical connector disclosed in Patent Document 1 needs a mechanism for moving the collimate lens away from and close to the optical fiber fixing part, for example, and thus has a complicated structure.

The present technology is intended to prevent laser hazard at disconnection with a simple structure.

Solutions to Problems

According to the concept of the present technology, an optical connector includes:

a tubular connector exterior; and a block that is incorporated on one end side of the connector exterior and in which a light emission portion or a light incident portion is mounted toward the other end side of the connector exterior, in which the light emission portion or the light incident portion is mounted on the block so that an optical axis direction of the light emission portion or the light incident portion is tilted relative to a longitudinal direction of the connector exterior, the light emission portion emits collimated light in accordance with light output from a light transmission path, and at least part of the emitted collimated light is incident on a light diffusion portion provided inside the connector exterior.

In the present technology, the block on which the light emission portion or the light incident portion is mounted toward the other end side of the connector exterior is incorporated on the one end side of the tubular connector exterior. The light emission portion or the light incident portion is mounted on the block so that the optical axis direction thereof is tilted relative to the longitudinal direction of the connector exterior. The light emission portion emits collimated light in accordance with light output from the light transmission path, and at least part of the emitted collimated light is incident on the light diffusion portion provided inside the connector exterior. For example, the block may include a lens through which the collimated light is emitted.

For example, the block may include alight direction change member configured to change, to the direction of the tilt, the direction of the light output from the light transmission path extending the longitudinal direction of the connector exterior. Furthermore, for example, the block may be provided with a maintaining portion that contacts a block of a mating connector to maintain a block interval at a particular distance.

In this manner, in the present technology, as a structure that tilts the optical axis direction of the light emission portion mounted on the block relative to the longitudinal direction of the connector exterior, at least part of light emitted from the light emission portion is incident on the light diffusion portion provided inside the connector exterior. Thus, the power of light exposed to the outside at disconnection can be reduced, and laser hazard can be prevented with a simple structure.

Furthermore, according to another concept of the present technology, an optical connector includes:

a tubular connector exterior; and a block that is incorporated on one end side of the connector exterior and in which a light emission portion or a light incident portion is mounted toward the other end side of the connector exterior, in which the light emission portion or the light incident portion is mounted on the block so that an optical axis direction of the light emission portion or the light incident portion is tilted relative to a longitudinal direction of the connector exterior, the light emission portion emits light condensed in accordance with light output from a light transmission path, and at least part of the emitted light is incident on a light diffusion portion provided inside the connector exterior.

In the present technology, the block on which the light emission portion or the light incident portion is mounted toward the other end side of the connector exterior is incorporated on the one end side of the tubular connector exterior. The light emission portion or the light incident portion is mounted on the block so that the optical axis direction thereof is tilted relative to the longitudinal direction of the connector exterior.

The light emission portion emits light condensed in accordance with light output from the light transmission path, and at least part of the emitted light is incident on the light diffusion portion provided inside the connector exterior. For example, the block may include a lens through which the condensed light is emitted. Furthermore, for example, the block may include a light direction change member configured to change, to the direction of the tilt, the direction of the light output from the light transmission path extending the longitudinal direction of the connector exterior.

In this manner, in the present technology, as a structure that tilts the optical axis direction of the light emission portion mounted on the block relative to the longitudinal direction of the connector exterior, at least part of light emitted from the light emission portion is incident on the light diffusion portion provided inside the connector exterior. Thus, the power of light exposed to the outside at disconnection can be reduced, and laser hazard can be prevented with a simple structure.

Furthermore, according to another concept of the present technology, an optical connector includes:

a tubular connector exterior; and a block that is incorporated on one end side of the connector exterior and in which a light emission portion or a light incident portion is mounted toward the other end side of the connector exterior, in which the light emission portion or the light incident portion is mounted on the block so that an optical axis direction of the light emission portion or the light incident portion is tilted relative to a longitudinal direction of the connector exterior, the light emission portion is a light emitting element configured to convert an electric signal into an optical signal, and part of light emitted from the light emitting element is incident on a light diffusion portion provided inside the connector exterior.

In the present technology, the block on which the light emission portion or the light incident portion is mounted toward the other end side of the connector exterior is incorporated on the one end side of the tubular connector exterior. The light emission portion or the light incident portion is mounted on the block so that the optical axis direction thereof is tilted relative to the longitudinal direction of the connector exterior. The light emission portion is a light emitting element configured to convert an electric signal into an optical signal, and at least part of light emitted from the light emitting element is incident on the light diffusion portion provided inside the connector exterior.

In this manner, in the present technology, as a structure that tilts the optical axis direction of the light emission portion (light emitting element configured to convert an electric signal into an optical signal) mounted on the block relative to the longitudinal direction of the connector exterior, at least part of light emitted from the light emission portion is incident on the light diffusion portion provided inside the connector exterior. Thus, the power of light exposed to the outside at disconnection can be reduced, and laser hazard can be prevented with a simple structure.

Furthermore, according to another concept of the present technology, an optical connector includes:

a tubular connector exterior;

a block that is incorporated on one end side of the connector exterior and in which a light emission portion or a light incident portion is mounted toward the other end side of the connector exterior; and a mirror structural body disposed on the other end side of the block and configured to change the direction of light emitted from the light emission portion to a direction tilted relative to a longitudinal direction of the connector exterior.

In the present technology, the block on which the light emission portion or the light incident portion is mounted toward the other end side of the connector exterior is incorporated on the one end side of the tubular connector exterior. The mirror structural body is disposed on the other end side of the block. In a case where the light emission portion is mounted on the block, the direction of light emitted from the light emission portion is changed to a direction tilted relative to the longitudinal direction of the connector exterior through the mirror structural body. Furthermore, in a case where the light incident portion is mounted on the block, the direction of light from a direction tilted relative to the longitudinal direction of the connector exterior is changed to the longitudinal direction of the connector exterior through the mirror structural body so that the light is incident on the light incident portion.

In this manner, in the present technology, the direction of light emitted from the light emission portion is tilted relative to the longitudinal direction of the connector exterior through the mirror structural body. Thus, light (laser beam) emitted from the light emission portion at disconnection can be emitted inside the connector exterior. Accordingly, the power of light exposed to the outside can be reduced, and laser hazard can be prevented with a simple structure.

Note that, in the present technology, for example, the light emission portion may be a light emitting element through which light collimated in accordance with light output from the light transmission path is emitted, through which light condensed in accordance with light output from the light transmission path is emitted, or that converts an electric signal into an optical signal, and at least part of light reflected by the mirror structural body may be incident on the light diffusion portion provided inside the connector exterior.

Effects of the Invention

According to the present technology, laser hazard at disconnection can be prevented with a simple structure. Note that effects described in the present specification are merely exemplary and the present invention is not limited thereto, but may have additional effects.

MODE FOR CARRYING OUT THE INVENTION

Hereinafter, modes (hereinafter referred to as embodiments) for implementing the present invention will be described. Note that the description will be given in the following order.

1. Embodiment
2. Exemplary application
3. Modification

1. Embodiment

[Exemplary Configuration of Electronic Device and Optical Cable]

Figure 1:
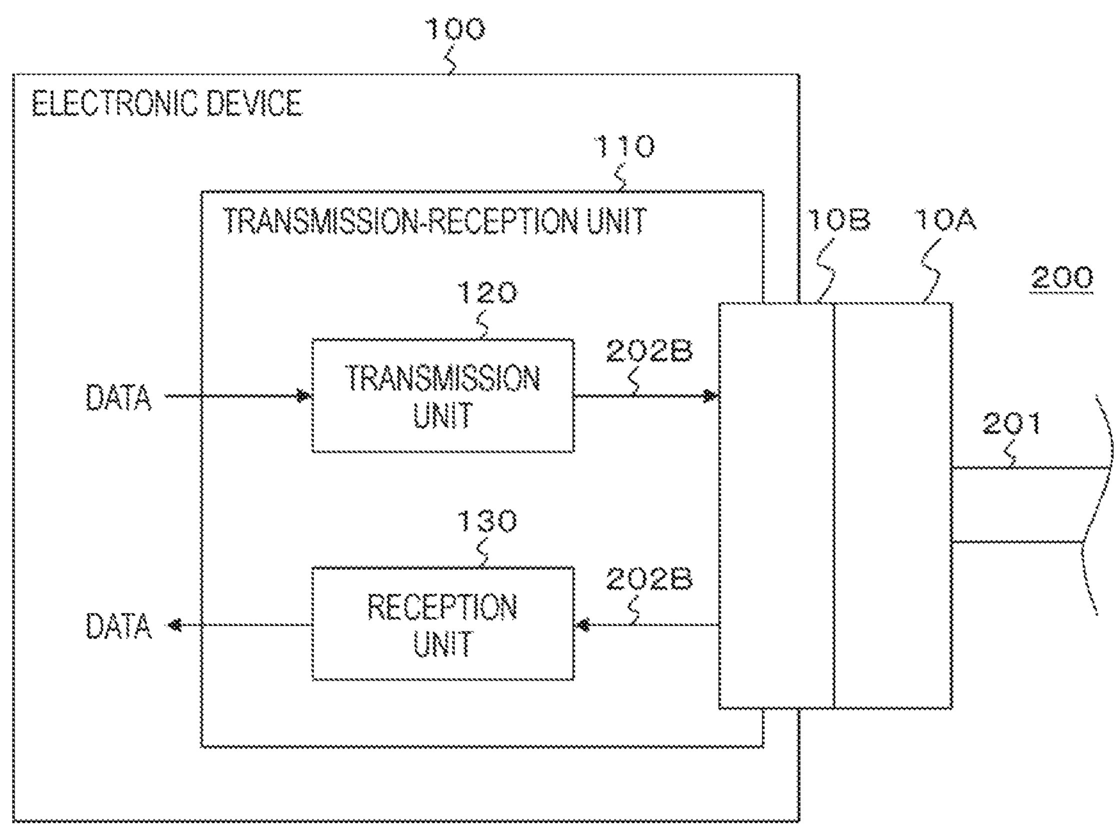
FIG. 1 is a diagram illustrating an exemplary configuration of an electronic device and an optical cable as an embodiment.

FIG. 1 illustrates an exemplary configuration of an electronic device 100 and an optical cable 200 as an embodiment. The electronic device 100 includes a transmission-reception unit 110. The transmission-reception unit 110 includes a transmission unit 120 and a reception unit 130 to perform communication. Furthermore, the transmission-reception unit 110 includes an optical connector 10B as a receptacle. The transmission-reception unit 110 transmits transmission data as an optical signal and receives reception data as an optical signal through the optical connector 10B.

The optical cable 200 includes an optical cable body 201 and an optical connector 10A as a plug. The optical cable 200 transmits an optical signal between the electronic device 100 and any other electronic device or a communication network such as the Internet.

Note that the electronic device 100 may be, for example, a mobile electronic device such as a cellular phone, a smartphone, a PHS, a PDA, a tablet PC, a laptop computer, a video camera, an IC recorder, a portable media player, an electronic organizer, an electronic dictionary, an electronic calculator, or a portable game machine, or another electronic device such as a desktop computer, a display device, a television receiver, a radio receiver, a video recorder, a printer, a car navigation system, a game machine, a router, a hub, or an optical line terminal end device (ONU). Alternatively, the electronic device 100 may be included in an electric product such as a refrigerator, a washing machine, a clock, an intercom, an air conditioning facility, a humidifier, an air cleaner, an illumination instrument, or a cooking instrument, or part or whole of a vehicle as described later.

"Exemplary Configuration of Optical Connector that Functions as Plug or Receptacle"

Optical connectors include an optical connector that functions as a plug and an optical connector that functions as a receptacle. Both optical connectors are engaged to achieve optical communication. In this example, the optical connector that functions as a plug and the optical connector that functions as a receptacle are both described, but it is clear that the opposite combination thereof function in a similar manner, and thus the description is given only on one combination.

Figure 2:
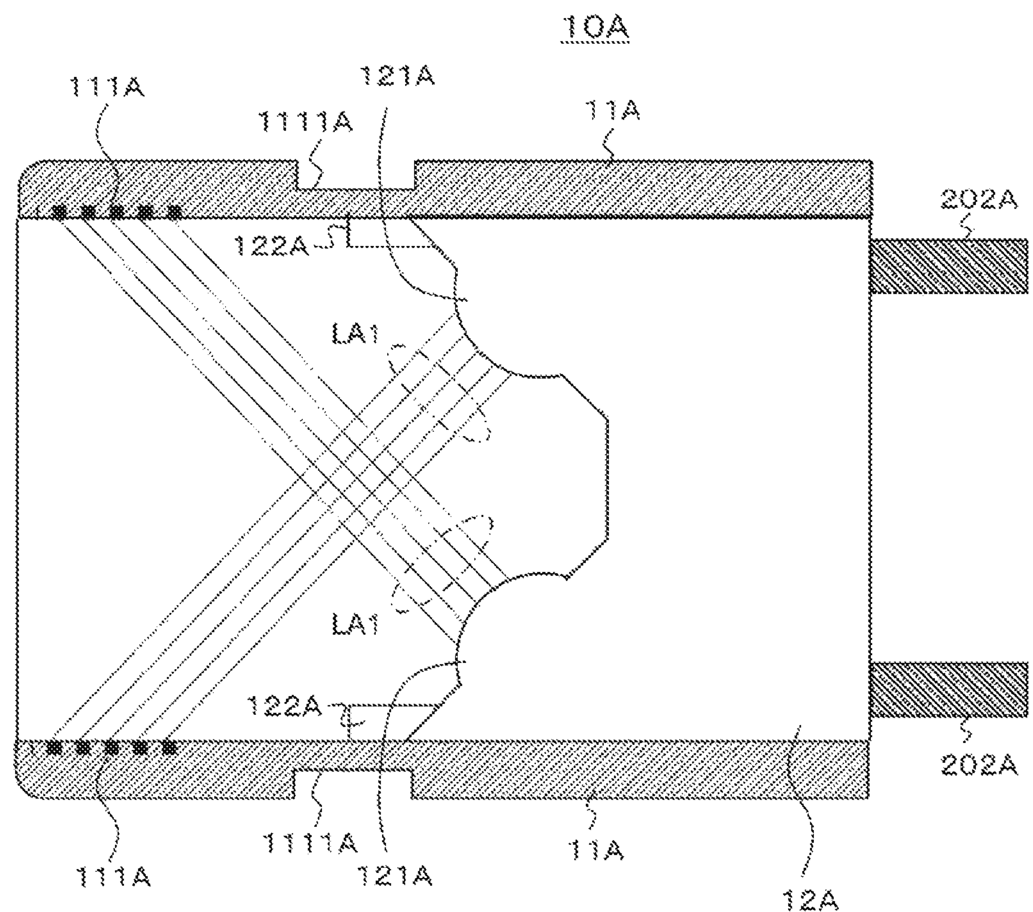
FIG. 2 is a cross-sectional view illustrating an exemplary configuration of an optical connector that functions as a plug.

FIG. 2 illustrates an exemplary configuration of the optical connector 10A. The optical connector 10A functions as a plug provided at an end part of the optical cable body 201. The optical connector 10A includes a tubular connector exterior 11A, and a block 12A on which a lens 121A is mounted.

The block 12A is incorporated on one end side of the connector exterior 11A. The lens 121A is mounted toward the other end side of the connector exterior 11A. The lens 121A is mounted on the block 12A while being tilted toward the center of the connector exterior 11A so that the optical axis direction thereof is tilted relative to the longitudinal direction of the connector exterior 11A. The lens 121A functions as a light emission portion in a case where an optical signal is transmitted, and the lens 121A functions as a light incident portion in a case where an optical signal is received.

Note that two lenses 121A are illustrated in the drawing, but the present technology is not limited to the configuration in the drawing, and lenses 121A in an optional number equal to or larger than one may be mounted on the block 12A in accordance with the number of light transmission paths 202A. For example, a lens array of lenses arrayed in the thickness direction (up-down direction in the drawing) and the width direction (direction perpendicular to the sheet of the drawing) of the optical connector 10A may be mounted on the block 12A.

In the case of functioning as a light emission portion, the lens 121A collimates and emits light (laser beam) output from the light transmission path 202A. In this case, the block 12A includes a light direction change member configured to change the direction of light output from the light transmission path 202A extending in the longitudinal direction of the connector exterior 11A to the optical axis direction of the lens 121A.

Furthermore, in the case of functioning as a light incident portion, the lens 121A condenses incident collimated light (laser beam) and inputs the light to the light transmission path 202A. In this case, the block 12A includes a light direction change member configured to change the direction of the light condensed through the lens 121A to the direction of the light transmission path 202A extending in the longitudinal direction of the connector exterior 11A. The light direction change member may be achieved by, for example, a light waveguide, a mirror structural body, or the like.

Figure 3:
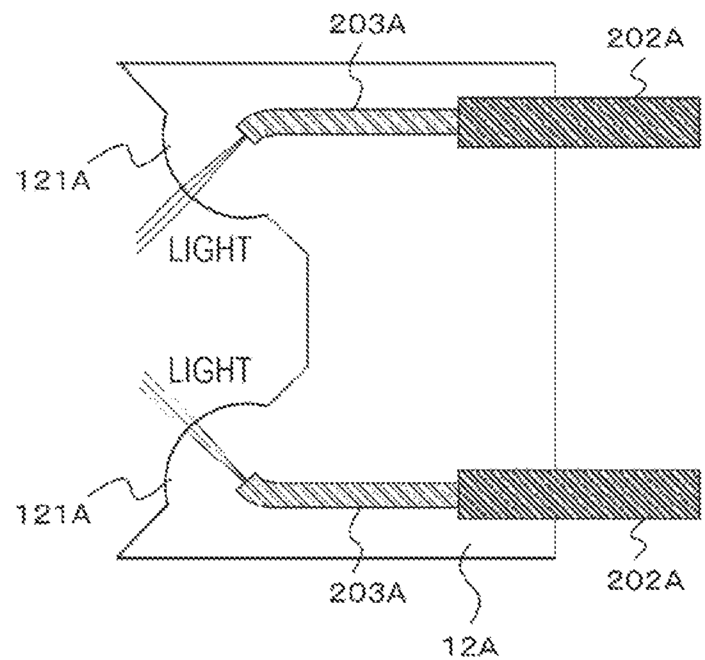
FIG. 3 is a diagram illustrating a case where a light direction change member is a light waveguide.

FIG. 3 illustrates a case where the light direction change member is a light waveguide 203A. In this case, the direction of light output from the light transmission path 202A is changed to the optical axis direction of the lens 121A through the light waveguide 203A, and the light is collimated and emitted through the lens 121A. Collimated light incident on the lens 121A is condensed through the lens 121A, the direction of the light is changed to the direction of the light transmission path 202A extending in the longitudinal direction of the connector exterior 11A through the light waveguide 203A, and the light is input to the light transmission path 202A.

Figure 4:
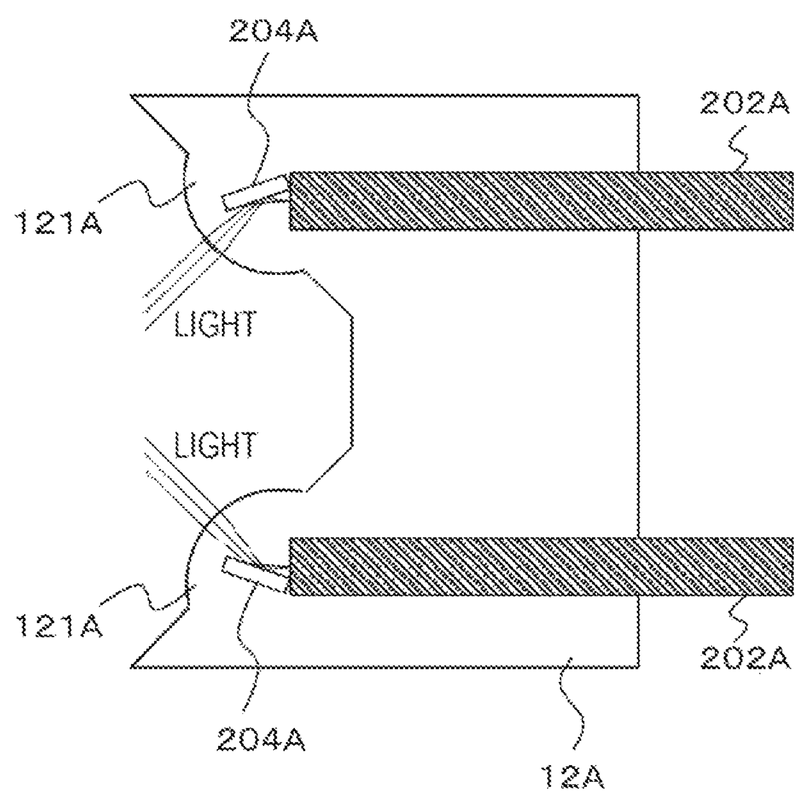
FIG. 4 is a diagram illustrating a case where the light direction change member is a mirror structural body.

Furthermore, FIG. 4 illustrates a case where the light direction change member is a mirror structural body 204A. In this case, the direction of light output from the light transmission path 202A is changed to the optical axis direction of the lens 121A through the mirror structural body 204A, and the light is collimated and emitted through the lens 121A. Collimated light incident on the lens 121A is condensed through the lens 121A, the direction of the light is changed to the direction of the light transmission path 202A extending in the longitudinal direction of the connector exterior 11A through the mirror structural body 204A, and the light is input to the light transmission path 202A. Note that, in the example illustrated in the drawing, the mirror structural body 204A achieves mirrored reflection, but the present technology is not limited thereto, and for example, the mirror structural body may be a reflection structure such as a concave mirror.

Returning to FIG. 2, the connector exterior 11A has such a length that at least part of collimated light (laser beam) LA1 emitted from the lens 121A functioning as the emission portion is incident inside the connector exterior 11A. Specifically, in this case, at least part of the collimated light LA1 emitted through the lens 121A is incident on the inside (inner wall) of the connector exterior 11A and diffused. In the example illustrated in the drawing, the whole light is incident on the inside. Accordingly, laser hazard at removal is prevented. In other words, the power of an optical signal exposed from the optical connector 10A is sufficiently reduced so that safety standard is satisfied.

A light diffusion portion 111A is formed at a site of the connector exterior 11A on which the collimated light is incident. The light diffusion portion 111A may be any member that diffuses light, and may be, for example, a rough surface or a porous film such as an alumite layer. An alumite layer can be easily and inexpensively formed and has an excellent light diffusion property. In a case where the light diffusion portion 111A is an alumite layer, the connector exterior 11A includes aluminum.

Furthermore, a maintaining portion 122A for contact with a block of a mating connector is provided on the lens 121A side of the block 12A. The maintaining portion 122A maintains block connection with a maintaining portion similarly provided to the block of the mating connector at a particular distance (interval maintaining mechanism).

In addition, the connector exterior 11A is provided with a lock groove 1111A in which a lock spring is stored to hold engagement with the mating connector (optical connector that functions as a receptacle). The connector exterior 11A can be held at a particular position at engagement by the lock groove 1111A. This mechanism (lock mechanism) of the lock groove 1111A and the lock spring has a lock strength that is canceled by removal force of a certain magnitude.

Figure 5:
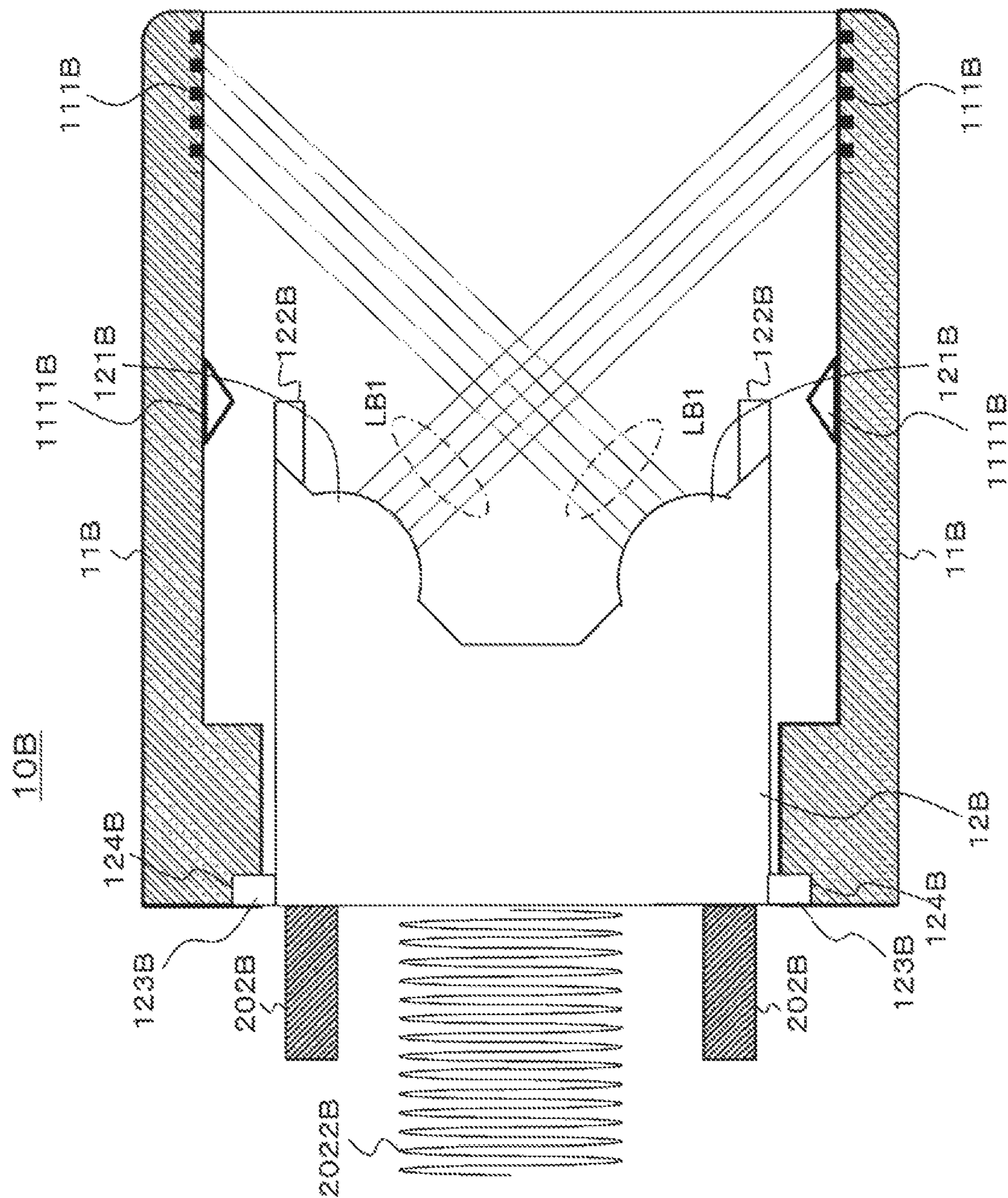
FIG. 5 is a cross-sectional view illustrating an exemplary configuration of an optical connector that functions as a receptacle.

FIG. 5 illustrates an exemplary configuration of the optical connector 10B. The optical connector 10B functions as a receptacle provided to a housing of the electronic device 100. The optical connector 10B includes a tubular connector exterior 11B, and a block 12B on which a lens 121B is mounted.

The block 12B is incorporated on one end side of the connector exterior 11B. The lens 121B is mounted toward the other end side of the connector exterior 11B. The lens 121B is mounted on the block 12B while being tilted toward the center of the connector exterior 11B so that the optical axis direction thereof is tilted relative to the longitudinal direction of the connector exterior 11B. The lens 121B functions as a light emission portion in a case where an optical signal is transmitted therethrough, and the lens 121B functions as a light incident portion in a case where an optical signal is received therethrough.

Note that the two lenses 121B are illustrated in the drawing, but the present technology is not limited to the configuration in the drawing, and lenses 121B in an optional number equal to or larger than one may be mounted on the block 12B in accordance with the number of light transmission paths 202B. For example, a lens array of lenses arrayed in the thickness direction (up-down direction in the drawing) and the width direction (direction perpendicular to the sheet of the drawing) of the optical connector 10B may be mounted on the block 12B.

In the case of functioning as a light emission portion, the lens 121B collimates and emits light (laser beam) output from a light transmission path 202B. In this case, the block 12B includes a light direction change member configured to change the direction of light output from the light transmission path 202B extending in the longitudinal direction of the connector exterior 11B to the optical axis direction of the lens 121B.

Furthermore, in the case of functioning as a light incident portion, the lens 121B condenses incident collimated light (laser beam) and inputs the light to the light transmission path 202B. In this case, the block 12B includes a light direction change member configured to change the direction of light condensed through the lens 121B to the direction of the light transmission path 202B extending in the longitudinal direction of the connector exterior 11B.

Although not described in detail, similarly to the case of the optical connector 10A described above, the light direction change member is achieved by a light waveguide or a mirror structural body (refer to FIGS. 3 and 4).

The connector exterior 11B has such a length that at least part of collimated light (laser beam) LB1 emitted from the lens 121B functioning as the emission portion is incident on the inside (inner wall) thereof. Specifically, in this case, at least part of the collimated light emitted from the lens 121B is incident on the inside (inner wall) of the connector exterior 11B and diffused. In the example illustrated in the drawing, the whole light is incident on the inside. Accordingly, laser hazard at removal is prevented. In other words, the power of an optical signal exposed from the optical connector 10A is sufficiently reduced so that safety standard is satisfied.

A light diffusion portion 111B is formed at a site of the connector exterior 11B on which collimated light is incident. The light diffusion portion 111B may be any member that diffuses light and may be, for example, a rough surface or a porous film such as an alumite layer. An alumite layer can be easily and inexpensively formed and has an excellent light diffusion property. In a case where the light diffusion portion 111B is an alumite layer, the connector exterior 11B includes aluminum.

Furthermore, a maintaining portion 122B for contact with a block of a mating connector is provided on the lens 121B side of the block 12B. This maintaining portion 122B maintains block connection with a maintaining portion similarly provided to the block of the mating connector at a particular distance (interval maintaining mechanism).

In addition, the connector exterior 11B is provided with a lock spring 1111B stored in a lock groove to hold engagement with the mating connector (optical connector that functions as a plug). The connector exterior 11B can be held at a particular position against pressing force of a spring as described later at engagement by the lock spring 1111B. This mechanism (lock mechanism) of the lock spring 1111B and the lock groove has a lock strength that is canceled by removal force of a certain magnitude.

Furthermore, the block 12B is installed in a state (floating state) movable in the longitudinal direction in the connector exterior 11B, and pressed toward an opening end by a spring 2022B (pressing mechanism). In this case, the block 12B is pressed toward the mating connector side at the start of contact with the block of the mating connector. Accordingly, at engagement, the contact with the block of the mating connector can be excellently maintained even in a situation such as wrench or insufficient insertion. Note that movement of the block 12B toward the opening end is regulated when a regulative protrusion 123B provided to the block 12B contacts a regulative recess 124B of the connector exterior 11B.

Figure 6:
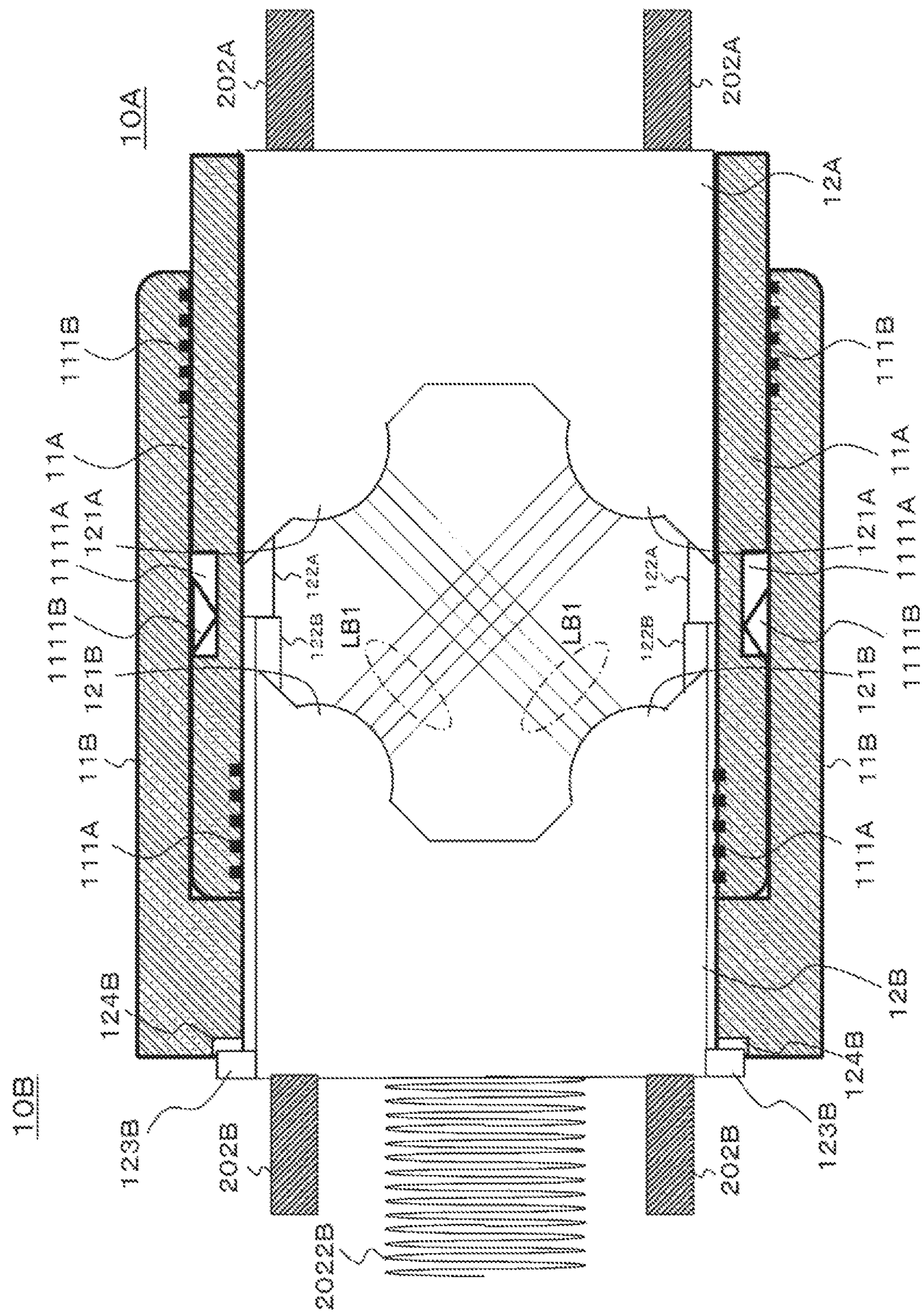
FIG. 6 is a diagram illustrating a state in which the optical connector that functions as a plug is connected with the optical connector that functions as a receptacle.

FIG. 6 illustrates a state in which the optical connector 10B and the optical connector 10A are engaged with each other, in other words, a state in which the optical connector 10A is inserted into the optical connector 10B and the optical connectors 10A and 10B are connected with each other. The fixed block 12A of the optical connector 10A and the block 12B of the optical connector 12B being pressed in a movable state by the spring 2022B are connected with each other through the maintaining portions 122A and 122B and fixed in a state in which communication is possible between the lens 121A and the lens 121B while both optical signals are tilted.

In the example illustrated in the drawing, for example, the lens 121B of the optical connector 10B functions as a light emission portion, and the lens 121A of the optical connector 10A functions as a light incident portion. The collimated light LB1 emitted from the lens 121B mounted on the lower side in the optical connector 10B in the drawing is incident on the lens 121A mounted on the upper side in the optical connector 10A in the drawing. Furthermore, the collimated light LB1 emitted from the lens 121B mounted on the upper side in the optical connector 10B in the drawing is incident on the lens 121A mounted on the lower side in the optical connector 10A in the drawing.

Note that similar description applies to an example in which the lens 121A of the optical connector 10A functions as a light emission portion, and the lens 121B of the optical connector 10B functions as a light incident portion. Furthermore, similar description applies to an example in which part of a plurality of lenses 121A of the optical connector 10A functions as a light emission portion and the other part thereof functions as a light incident portion, whereas part of a plurality of lenses 121B of the optical connector 10B functions as a light incident portion and the other part thereof functions as the light emission portion.

Furthermore, the lock spring 1111B of the optical connector 10B is engaged with the lock groove 1111A of the optical connector 10A, and the optical connector 10A and the optical connector 10B are fixed at an engagement distance in a communicable manner. This engagement is easily canceled by removal at strength of a certain magnitude.

As described above, in the optical connectors 10A and 10B illustrated in FIGS. 2 and 5, at least part of collimated light (laser beam) emitted from the lenses 121A and 121B as light emission portions at disconnection is incident on the light diffusion portions 111A and 111B inside the connector exteriors 11A and 11B and diffused. Thus, light intensity sufficiently decreases in a distance defined by safety criteria and satisfies safety standards. Accordingly, the optical connectors 10A and 10B can prevent laser hazard at disconnection (removal) with a simple structure.

Furthermore, the block 12B of the optical connector 10B illustrated in FIG. 5 is movably provided, and pressed toward the optical connector 10A side by the spring 2022B in a state in which the optical connector 10A illustrated in FIG. 2 is inserted into the optical connector 10B and the block 12B starts contacting the block 12A. Then, furthermore, in a state in which the optical connectors 10A and 10B illustrated in FIGS. 2 and 5 are engaged, the lock spring 1111B of the optical connector 10B is engaged with the lock groove 1111A of the optical connector 10A, and the state of engagement between the optical connector 10A and the optical connector 10B is maintained against pressing force by the spring 2022B. Thus, reliable connection between the blocks can be achieved at engagement between the optical connector 10A and the optical connector 10B, and furthermore, the engagement state can be excellently maintained. Note that, in the example of the optical connectors 10A and 10B in FIGS. 2 and 5, the blocks 12A and 12B each include a lens through which collimated light is emitted or condensed. However, each optical connector (optical connector block) does not necessarily need to include a lens. For example, collimated light generated on a substrate may be incident on the connector through an optical component such as a mirror, or collimated light may be guided to a substrate through an optical component such as a mirror and incident on a light receiving element. Also in the following examples, the block of each optical connector does not necessarily need to include a lens (light emitting element or light receiving element).

"Exemplary Configuration of Electronic Device"

The following describes an exemplary configuration of the electronic device 100. As illustrated in FIG. 1, the electronic device 100 includes the transmission-reception unit 110. The transmission-reception unit 110 includes the transmission unit 120 configured to transmit an optical signal, the reception unit 130 configured to receive an optical signal, and the optical connector 10B.

The transmission unit 120 converts transmission data from an electric signal to an optical signal, and transfers the optical signal to the optical connector 10B through the light transmission path 202B. Furthermore, the reception unit 130 obtains reception data by converting an optical signal transferred from the optical connector 10B through the light transmission path 202B into an electric signal.

Figure 7:
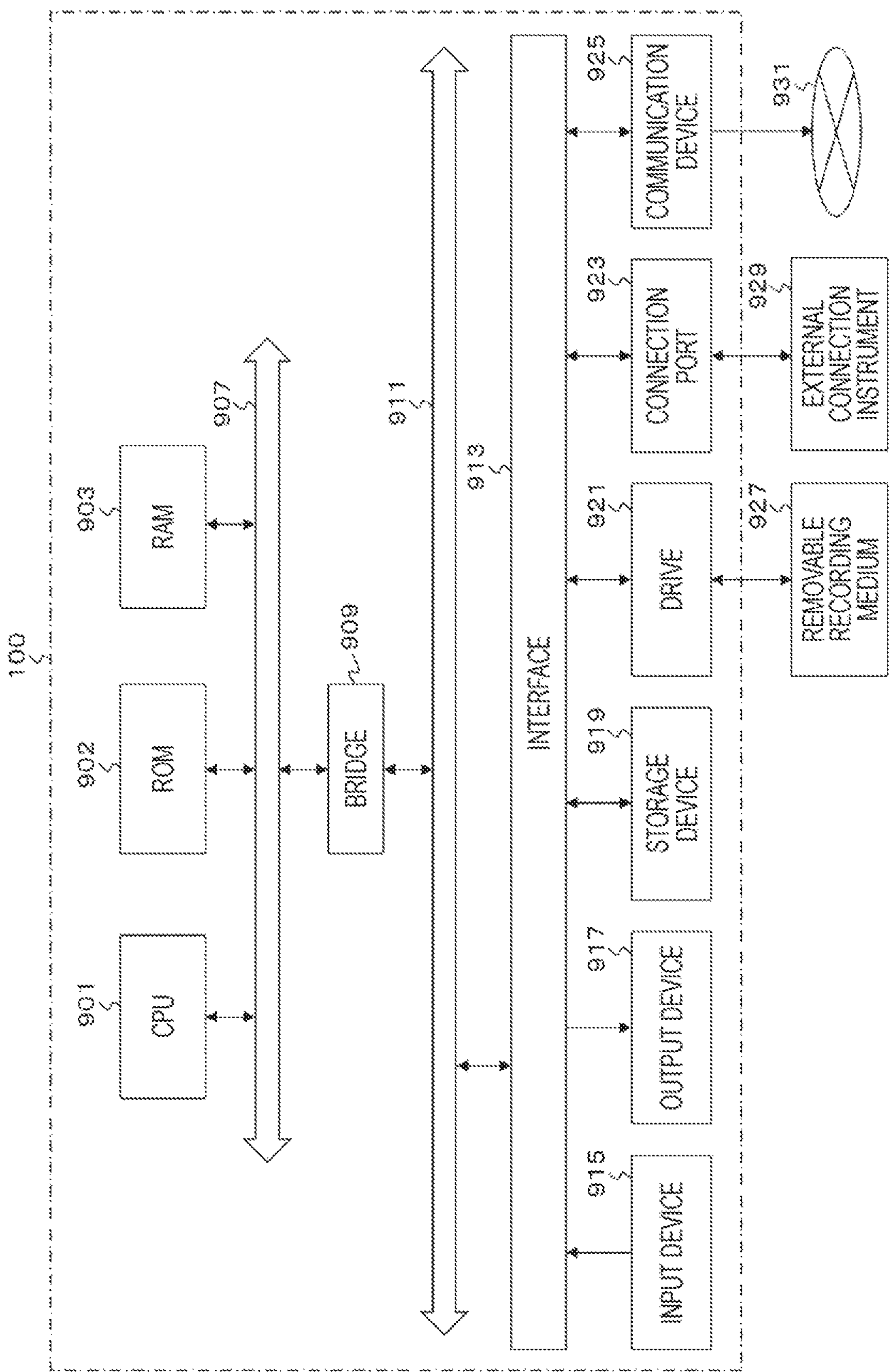
FIG. 7 is a block diagram illustrating an exemplary hardware configuration of an electronic device.

FIG. 7 illustrates an exemplary hardware configuration of the electronic device 100. Note that the hardware configuration of the electronic device 100 is not limited thereto.

The electronic device 100 mainly includes a CPU 901, a ROM 902, and a RAM 903. Furthermore, the electronic device 100 also includes a host bus 907, a bridge 909, an external bus 911, an interface 913, an input device 915, an output device 917, a storage device 919, a drive 921, a connection port 923, and a communication device 925.

The CPU 901 functions as an arithmetic processing device and a control device, and controls whole or part of operation in the electronic device 100 in accordance with various computer programs recorded in the ROM 902, the RAM 903, the storage device 919, or a removable recording medium 927. The ROM 902 stores the computer programs used by the CPU 901, calculation parameters, and the like. The RAM 903 primarily stores the computer programs used by the CPU 901, and parameters and the like that change as appropriate at execution of the computer programs. These are connected with each other through the host bus 907 achieved by an internal bus such as a CPU bus.

The host bus 907 is connected with the external bus 911 such as a peripheral component interconnect/interface (PCI) bus through the bridge 909.

The input device 915 is an operation means operated by a user, such as a mouse, a keyboard, a touch panel, a button, a switch, or a lever. Furthermore, the input device 915 may be, for example, a remote control means (what is called a remote controller) using infrared or other radio wave, or an external connection instrument 929 such as a cellular phone or a PDA corresponding to operation of the electronic device 100. Further, the input device 915 is achieved by, for example, an input control circuit configured to generate an input signal on the basis of information input by the user using the above-described operation means and output the input signal to the CPU 901, or the like. The user of the electronic device 100 can input various kinds of data and instruct a processing operation to the electronic device 100 through operation of the input device 915.

The output device 917 includes a device capable of visually or audibly notifying the user of acquired information. Examples of such devices include a display device such as a CRT display device, a liquid crystal display device, a plasma display device, an EL display device, and a lamp, a sound output device such as a speaker or a head phone, a printer device, a cellular phone, and a facsimile. The output device 917 outputs, for example, results obtained through various kinds of processing performed by the electronic device 100. Specifically, the display device displays, in a form of texts or images, results obtained through various kinds of processing performed by the electronic device 100. The sound output device converts an audio signal including regenerated voice data, acoustic data, and the like into an analog signal and outputs the analog signal.

The storage device 919 is a data storage device configured as an exemplary storage unit of the electronic device 100. The storage device 919 is achieved by, for example, a magnetic storage unit device such as a hard disk drive (HDD), a semiconductor storage device, an optical storage device, a magneto-optical storage device, or the like. The storage device 919 stores, for example, the computer programs and various kinds of data executed by the CPU 901 and various kinds of data acquired from the outside.

The drive 921 is a recording medium reader-writer built in or externally connected with the electronic device 100. The drive 921 reads information recorded in the mounted removable recording medium 927 such as a magnetic disk, an optical disk, a magneto optical disc, or a semiconductor memory, and outputs the information to the RAM 903. Furthermore, the drive 921 can write a record on the mounted removable recording medium 927 such as a magnetic disk, an optical disk, a magneto optical disc, or a semiconductor memory.

The removable recording medium 927 is, for example, a DVD media, a HD-DVD media, a Blu-ray media, or the like. Furthermore, the removable recording medium 927 may be a compact flash (registered trademark) (CF), a flash memory, a secure digital memory card (SD memory card), or the like. Furthermore, the removable recording medium 927 may be, an integrated circuit card (IC card) on which a non-contact IC chip is mounted, an electronic device, or the like, for example.

The connection port 923 is a port for directly connecting an instrument to the electronic device 100. Examples of the connection port 923 include a universal serial bus (USB) port, an IEEE1394 port, and a small computer system interface (SCSI) port. Other examples of the connection port 923 include an RS-232C port, an optical-digital terminal, and a high-definition multimedia interface (HDMI) port. When the external connection instrument 929 is connected to the connection port 923, the electronic device 100 directly acquires various kinds of data from the external connection instrument 929, and provides various kinds of data to the external connection instrument 929. Note that the above-described optical-digital terminal may be configured as the optical transmission-reception unit 110 including the optical communication connector 10B described above.

The communication device 925 is, for example, a communication interface achieved by a communication device or the like for connection with a communication network 931. In the present embodiment, the communication device 925 includes the above-described optical transmission-reception unit 110 including the optical communication connector 10B. The communication device 925 may be an optical communication router. Furthermore, the communication device 925 may further include a wired or wireless local area network (LAN) communication card, a Bluetooth (registered trademark) communication card, a wireless USB (WUSB) communication card, or the like.

Furthermore, the communication device 925 may include an asymmetric digital subscriber line (DSL) router, a various communication modem, or the like. The communication device 925 can communicate signals and the like with the Internet or another communication instrument according to FTTx such as FTTR, FTTB, FTTH, or FTTD, or a predetermined protocol such as TCP/IP. Furthermore, the communication network 931 connected with the communication device 925 is achieved by a network or the like connected in a wired or wireless manner, and may be, for example, the Internet, a home LAN, infrared communication, radio wave communication, satellite communication, or the like.

"Exemplary Configuration of Optical Cable"

The following describes an exemplary configuration of the optical cable 200. As illustrated in FIG. 1, the optical cable 200 includes the optical cable body 201 and the optical connector 10A. The cable body 201 includes the light transmission path 202A (refer to FIG. 2) inside. The light transmission path 202A is, for example, an optical fiber. Note that the light transmission path 202A may be any member through which light can be transmitted, and may be other than an optical fiber. The light transmission path 202A is provided with a cover on the outer peripheral surface as appropriate. Furthermore, the light transmission path 202A is connected with the optical connector 10A on a leading end side.

Such an optical cable 200 can be used in connection for optical communication between an electronic device such as the electronic device 100 described above and another instrument.

"Another Exemplary Configuration of Optical Connector that Functions as Plug or Receptacle"

The following describes another exemplary configuration of an optical connector that functions as a plug or a receptacle. Note that illustration and thus description of the pressing mechanism, the lock mechanism, and the block interval maintaining mechanism will be omitted in this exemplary configuration. This is similar in another exemplary configuration.

Figure 8:
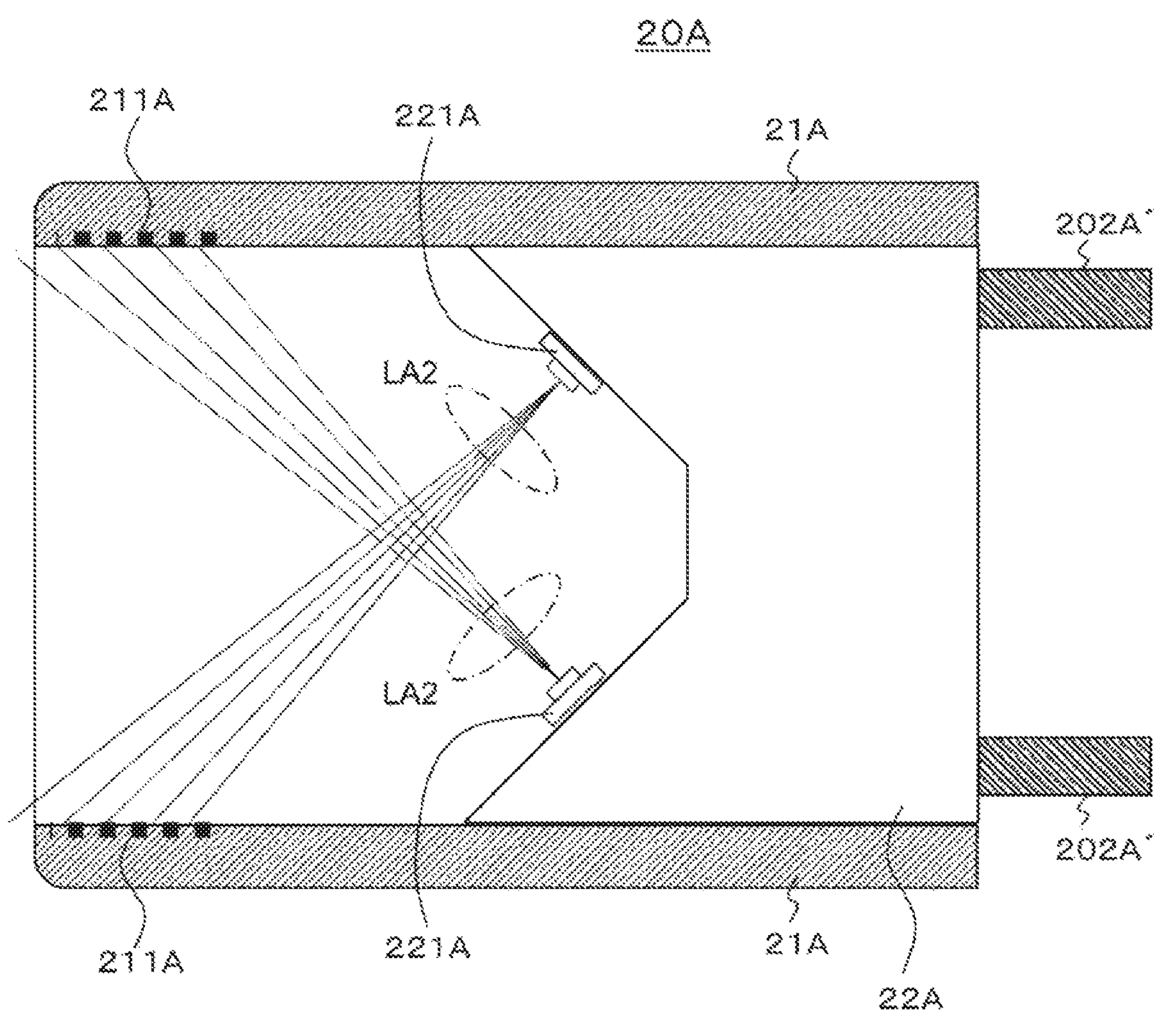
FIG. 8 is a cross-sectional view illustrating an exemplary configuration of the optical connector that functions as a plug.

FIG. 8 illustrates an exemplary configuration of an optical connector 20A. Similarly to the above-described optical connector 10A, the optical connector 20A functions as a plug provided at the end part of the optical cable body 201. The optical connector 20A includes a tubular connector exterior 21A, and a block 22A on which an optical element 221A is mounted.

The block 22A is incorporated on one end side of the connector exterior 21A. The optical element 221A is mounted toward the other end side of the connector exterior 21A. The optical element 221A is mounted on the block 22A while being tilted toward the center of the connector exterior 21A so that the optical axis direction thereof is tilted relative to the longitudinal direction of the connector exterior 21A.

Note that the two optical elements 221A are illustrated in the drawing, but the present technology is not limited to the configuration in the drawing, and optical elements 221A in an optional number equal to or larger than one may be mounted on the block 22A in accordance with the number of electricity transmission paths 202A'. For example, an optical element array of optical elements arrayed in the thickness direction (up-down direction in the drawing) and the width direction (direction perpendicular to the sheet of the drawing) of the optical connector 20A may be mounted on the block 22A. Note that each electricity transmission path 202A' replaces the above-described light transmission path 202A.

The optical element 221A is a light emitting element that functions as a light emission portion in a case where an optical signal is transmitted therethrough, and converts an electric signal transferred through the electricity transmission path 202A' into an optical signal (laser beam) and emits the optical signal. The optical element 221A is a light receiving element that functions as a light incident portion in a case where an optical signal is received therethrough, and converts an incident optical signal (laser beam) into an electric signal and transfers the electric signal to the electricity transmission path 202A'.

The connector exterior 21A has such a length that at least part of light (laser beam) LA2 emitted from the optical element 221A functioning as a light emission portion is incident on the inside (inner wall) thereof. Specifically, in this case, at least part of the light LA2 emitted from the optical element 221A is incident on the inside (inner wall) of the connector exterior 21A and diffused. In the example illustrated in the drawing, part thereof is incident. Accordingly, laser hazard at removal is prevented.

A light diffusion portion 211A is formed at a site of the connector exterior 21A on which the laser beam is incident. The light diffusion portion 211A may be any member that diffuses light and may be, for example, a rough surface or a porous film such as an alumite layer. An alumite layer can be easily and inexpensively formed and has an excellent light diffusion property. In a case where the light diffusion portion 211A is an alumite layer, connector exterior 21A includes aluminum.

Figure 9:
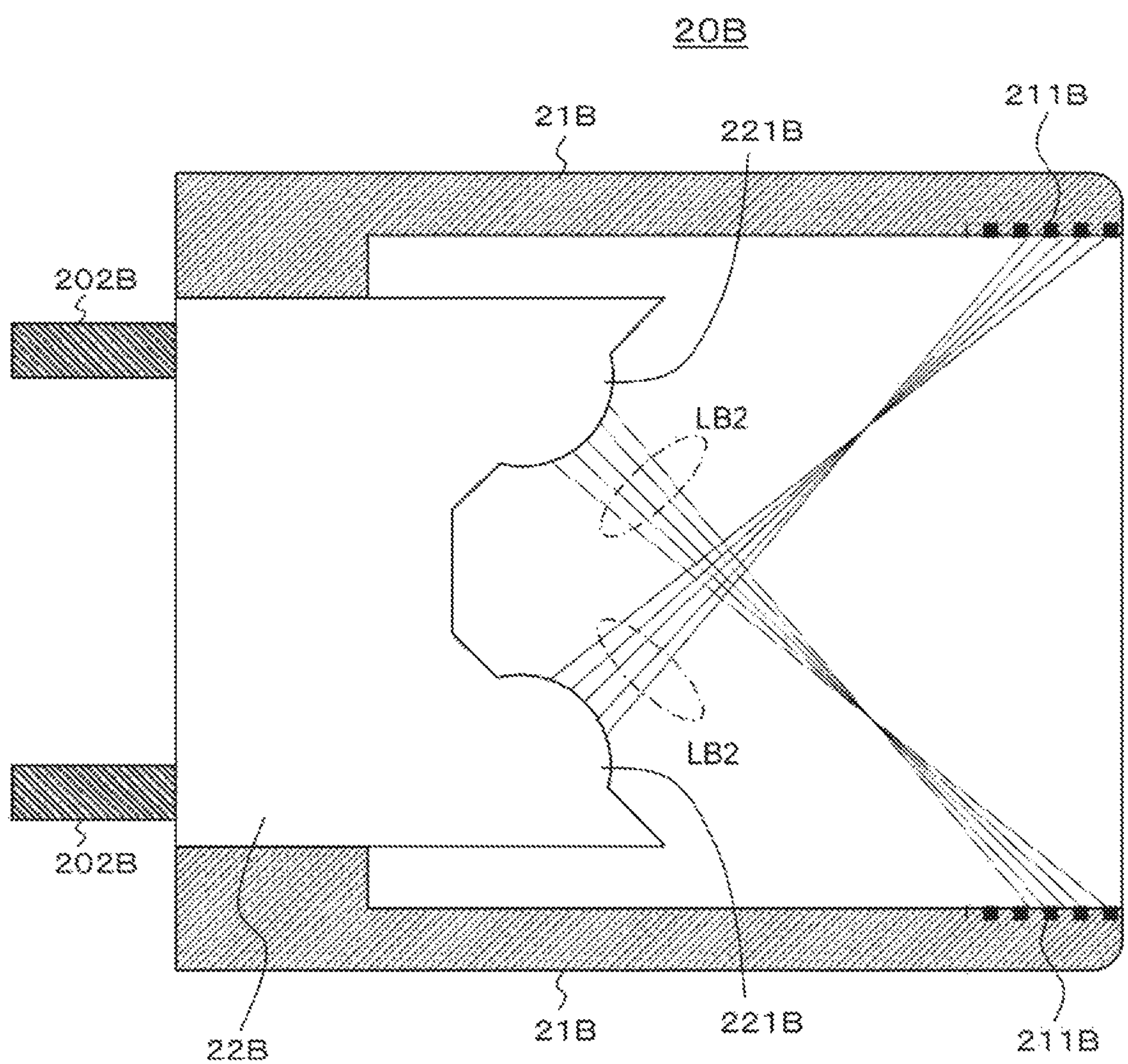
FIG. 9 is a cross-sectional view illustrating an exemplary configuration of the optical connector that functions as a receptacle.

FIG. 9 illustrates an exemplary configuration of an optical connector 20B. Similarly to the above-described optical connector 10B, the optical connector 20B functions as a receptacle provided to the housing of the electronic device 100. The optical connector 20B includes a tubular connector exterior 21B, and a block 22B on which a lens 221B is mounted. The block 22B is incorporated on one end side of the connector exterior 21B.

The lens 221B is mounted toward the other end side of the connector exterior 21B. The lens 221B is mounted on the block 22B while being tilted toward the center of the connector exterior 21B so that the optical axis direction thereof is tilted relative to the longitudinal direction of the connector exterior 21B. The lens 221B functions as a light emission portion in a case where an optical signal is transmitted therethrough, and the lens 221B functions as alight incident portion in a case where an optical signal is received therethrough.

Note that the two lenses 221B are illustrated in the drawing, but the present technology is not limited to the configuration in the drawing, and lenses 221B in an optional number equal to or larger than one may be mounted on the block 22B in accordance with the number of light transmission paths 202B. For example, a lens array of lenses arrayed in the thickness direction (up-down direction in the drawing) and the width direction (direction perpendicular to the sheet of the drawing) of the optical connector 20B may be mounted on the block 22B.

The lens 221B condenses and emits light (laser beam) output from the light transmission path 202B in the case of functioning as a light emission portion. In this case, the block 22B includes a light direction change member configured to change the direction of light output from the light transmission path 202B extending in the longitudinal direction of the connector exterior 21B to the optical axis direction of the lens 221B.

Furthermore, in the case of functioning as a light incident portion, the lens 221B condenses and refracts incident light (laser beam) and inputs the light to the light transmission path 202B. In this case, the block 12B includes a light direction change member configured to change the direction of light condensed through the lens 221B to the direction of the light transmission path 202B extending in the longitudinal direction of the connector exterior 21B.

Although not described in detail, the light direction change member includes, for example, a light waveguide or a mirror structural body (refer to FIGS. 3 and 4).

The connector exterior 21B has such a length that at least part of light (laser beam) LB2 emitted from the lens 221B functioning as the emission portion is incident on the inside (inner wall) thereof. Specifically, in this case, at least part of the light LB2 emitted from the lens 221B is incident on the inside (inner wall) of the connector exterior 21B and diffused. In the example illustrated in the drawing, the whole light is incident on the inside. Accordingly, laser hazard is prevented.

A light diffusion portion 211B is formed at a site of the connector exterior 21B on which emission light is incident. The light diffusion portion 211B may be any member that diffuses light and may be, for example, a rough surface or a porous film such as an alumite layer. An alumite layer can be easily and inexpensively formed and has an excellent light diffusion property. In a case where the light diffusion portion 211B is an alumite layer, the connector exterior 21B includes aluminum.

Figure 10:
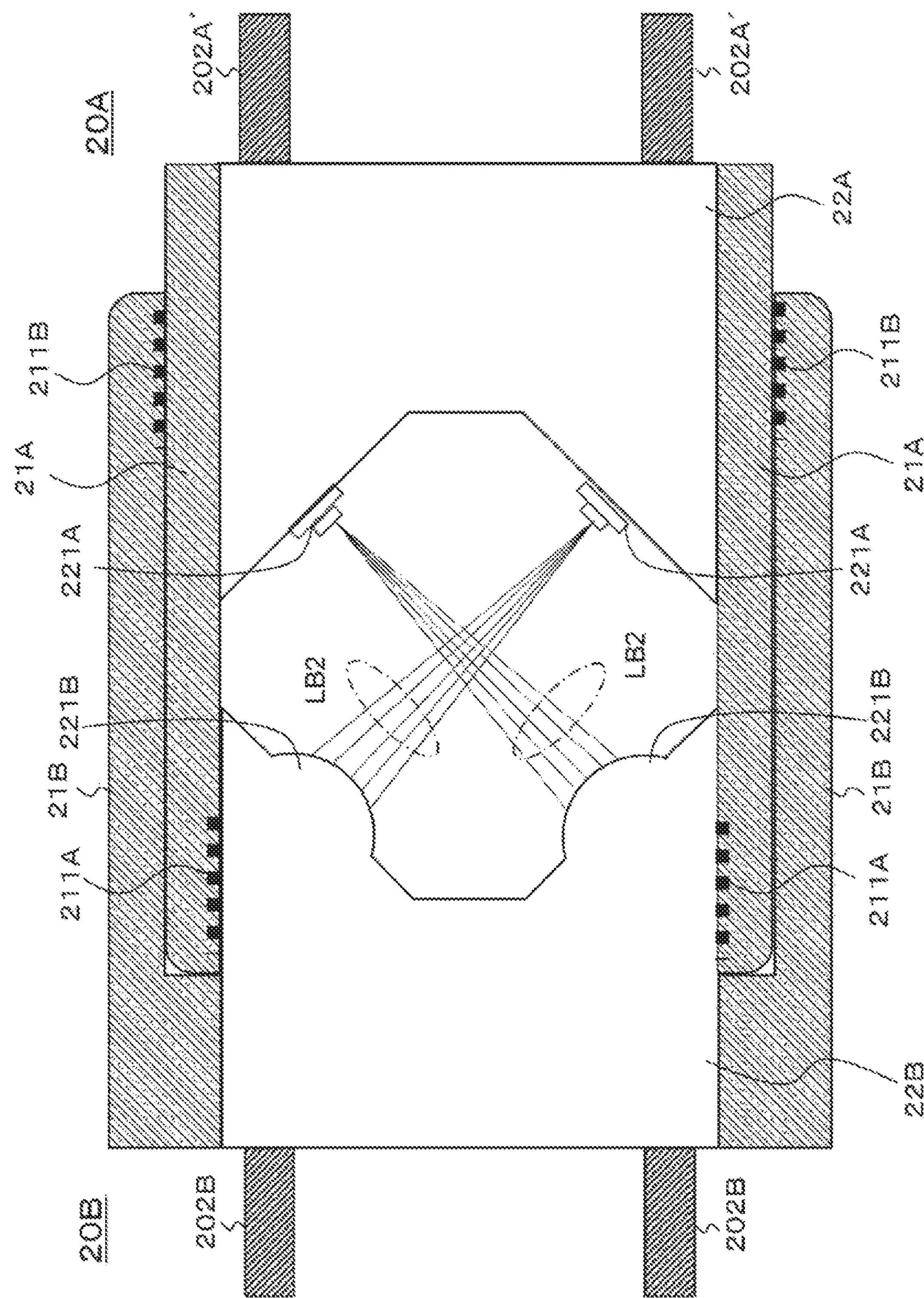
FIG. 10 is a diagram illustrating a state in which the optical connector that functions as a plug is connected with the optical connector that functions as a receptacle.

FIG. 10 illustrates a state in which the optical connector 20A is inserted into the optical connector 20B and the optical connectors 20A and 20B are connected with each other. In this case, the optical element 221A of the optical connector 20A and the lens 221B of the optical connector 20B face each other, and light (laser beam) emitted from the lens 221B or the optical element 221A functioning as a light emission portion is incident on the optical element 221A or the lens 221B facing thereto, thereby performing optical signal transmission.

In the example illustrated in the drawing, for example, the lens 221B of the optical connector 20B functions as a light emission portion, and the optical element 221A of the optical connector 20A functions as a light incident portion. The light LB2 emitted from the lens 221B mounted on the lower side in the optical connector 20B in the drawing is incident on the optical element 221A mounted on the upper side in the optical connector 20A in the drawing. Furthermore, the light LB2 emitted from the lens 221B mounted on the upper side in the optical connector 20B in the drawing is incident on the optical element 221A mounted on the lower side in the optical connector 20A in the drawing.

Note that similar description applies to an example in which the optical element 221A of the optical connector 20A functions as a light emission portion and the lens 221B of the optical connector 20B functions as a light incident portion. Furthermore, similar description applies to an example in which part of a plurality of optical elements 221A of the optical connector 20A functions as a light emission portion and the other part thereof functions as a light incident portion, whereas part of a plurality of lenses 221B of the optical connector 20B functions as an emission portion and the other part thereof functions as a light incident portion.

As described above, in the optical connectors 20A and 20B illustrated in FIGS. 8 and 9, at least part of light (laser beam) emitted from the optical element 221A and the lens 221B as light emission portions at disconnection is incident on the light diffusion portions 211A and 211B inside the connector exteriors 21A and 21B and diffused, and thus light intensity sufficiently decreases in a distance defined by safety criteria and satisfies the safety criteria. Accordingly, the optical connectors 20A and 20B can prevent laser hazard at disconnection (removal) with a simple structure.

Note that, in the above description, the optical connector 20A functioning as a plug includes the optical element 221A, and the optical connector 20B functioning as a receptacle includes the lens 221B. However, the optical connector 20A functioning as a plug may include a lens, and the optical connector 20B functioning as a receptacle may include an optical element. Further, the optical connector 20A functioning as a plug may include a plurality of light emission portions and/or light incident portions, part thereof may function as a lens, and the other part may function as an optical element, and the optical connector 20B functioning as a receptacle may include a plurality of light emission portions and/or light incident portions, part thereof may function as a lens, and the other part may function as an optical element.

"Another Exemplary Configuration of Optical Connector that Functions as Plug or Receptacle"

Figure 11:
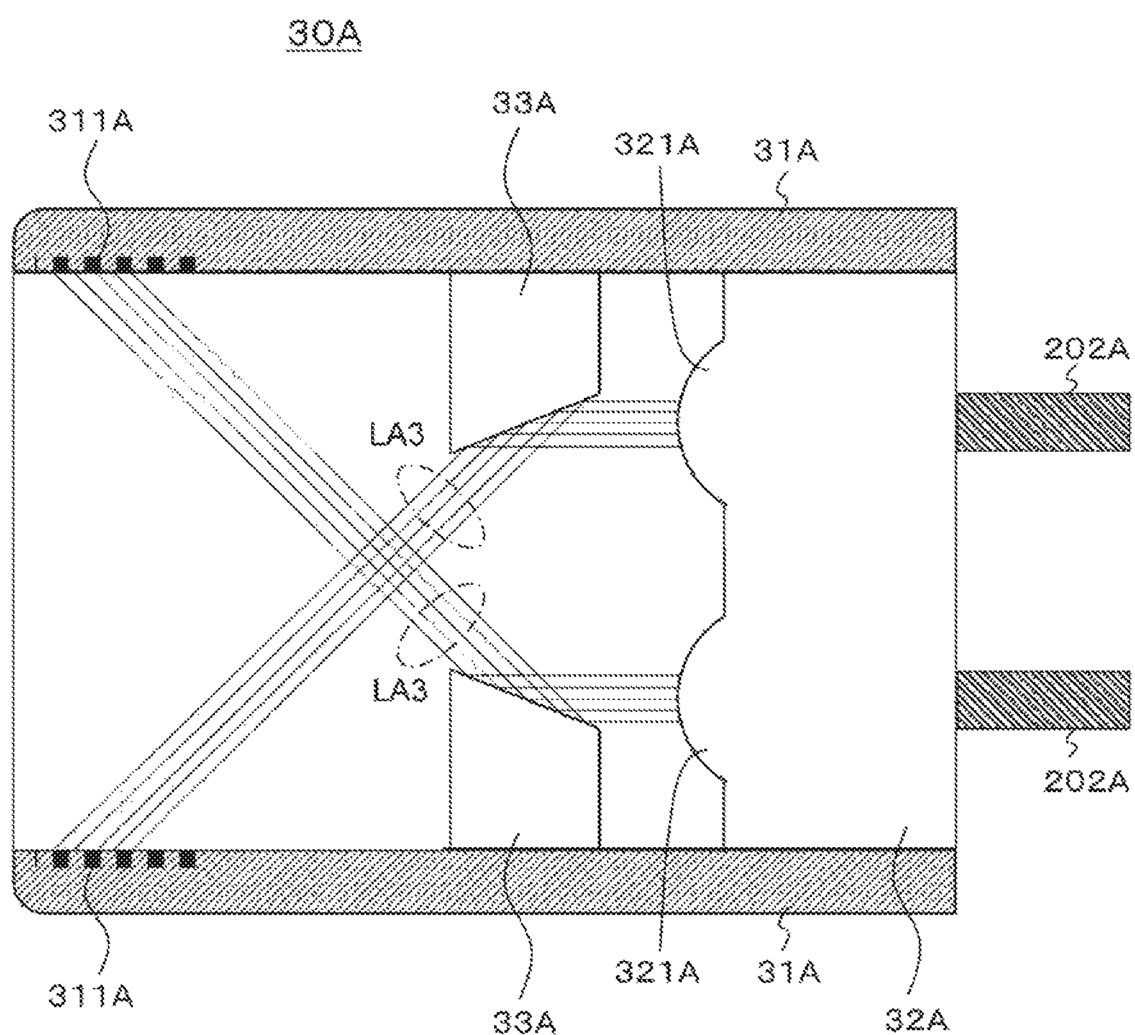
FIG. 11 is a cross-sectional view illustrating an exemplary configuration of the optical connector that functions as a plug.

FIG. 11 illustrates an exemplary configuration of an optical connector 30A. Similarly to the above-described optical connector 10A, the optical connector 30A functions as a plug provided at the end part of the optical cable body 201. The optical connector 30A includes a tubular connector exterior 31A, a block 32A on which a lens 321A is mounted, and a mirror structural body 33A.

The block 32A is incorporated on one end side of the connector exterior 31A. The lens 321A is mounted toward the other end side of the connector exterior 31A. The lens 321A is mounted on the block 32A so that the optical axis direction thereof aligns with the longitudinal direction of the connector exterior 31A. The lens 321A functions as a light emission portion in a case where an optical signal is transmitted therethrough, and the lens 321A functions as a light incident portion in a case where an optical signal is received therethrough.

Note that the two lenses 321A are illustrated in the drawing, but the present technology is not limited to the configuration in the drawing, and lenses 321A in an optional number equal to or larger than one may be mounted on the block 32A in accordance with the number of light transmission paths 202A. For example, a lens array of lenses arrayed in the thickness direction (up-down direction in the drawing) and the width direction (direction perpendicular to the sheet of the drawing) of the optical connector 30A may be mounted on the block 32A.

In the case of functioning as a light emission portion, the lens 321A collimates and emits light (laser beam) output from the light transmission path 202A. Furthermore, in the case of functioning as a light incident portion, the lens 321A condenses incident collimated light (laser beam) and inputs the light to the light transmission path 202A.

The mirror structural body 33A is disposed on the other end side corresponding to each lens 321A mounted on the block 32A. Note that, in the example illustrated in the drawing, the mirror structural body 33A achieves mirrored reflection, but the present technology is not limited thereto, and the mirror structural body 33A may be, for example, a reflection structure such as a concave mirror or a reflection structure using the total reflection of a prism.

In a case where the lens 321A functions as a light emission portion, the mirror structural body 33A reflects, to the inside at an appropriate angle, collimated light (laser beam) emitted from the lens 321A in the longitudinal direction of the connector exterior 31A, and changes the direction thereof to a direction tilted relative to the longitudinal direction of the connector exterior 31A. Furthermore, in a case where the lens 321A functions as a light incident portion, the mirror structural body 33A reflects collimated light (laser beam) from a direction tilted relative to the longitudinal direction of the connector exterior 31A so that the collimated light is incident on the lens 321A, and changes the direction thereof to the longitudinal direction of the connector exterior 31A.

The connector exterior 31A has such a length that at least part of collimated light (laser beam) LA3 emitted from the lens 321A functioning as the emission portion and reflected by the mirror structural body 33A is incident on the inside (inner wall) thereof. Specifically, in this case, at least part of the collimated light LA3 emitted from the lens 321A and reflected by the mirror structural body 33A is incident on the inside (inner wall) of the connector exterior 31A and diffused. In the example illustrated in the drawing, the whole light is incident on the inside. Accordingly, laser hazard at removal is prevented.

A light diffusion portion 311A is formed at a site of the connector exterior 31A on which collimated light is incident. The light diffusion portion 311A may be any member that diffuses light and may be, for example, a rough surface or a porous film such as an alumite layer. An alumite layer can be easily and inexpensively formed and has an excellent light diffusion property. In a case where the light diffusion portion 311A is an alumite layer, the connector exterior 31A includes aluminum.

Figure 12:
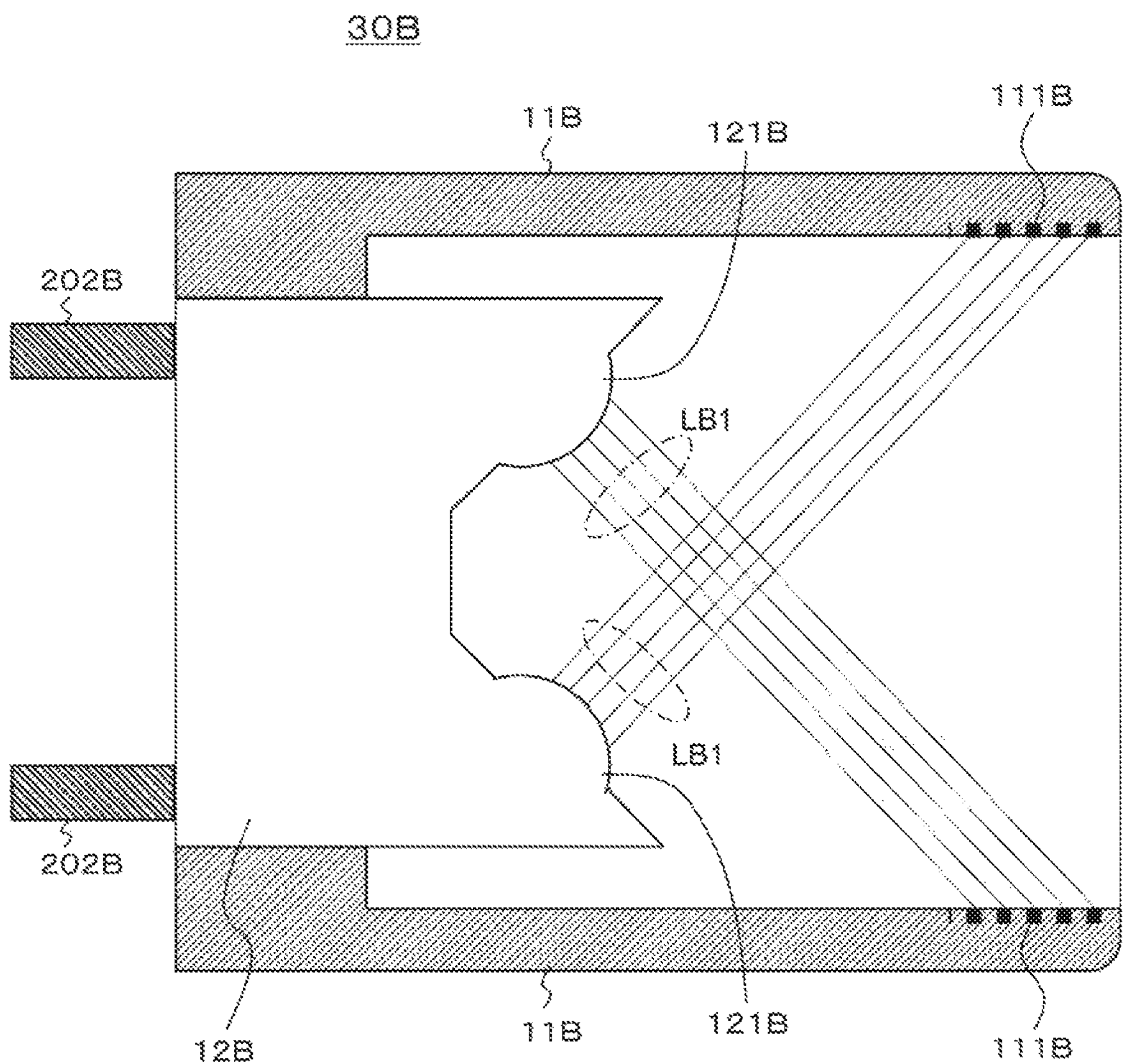
FIG. 12 is a cross-sectional view illustrating an exemplary configuration of the optical connector that functions as a receptacle.

FIG. 12 illustrates an exemplary configuration of an optical connector 30B. Similarly to the above-described optical connector 10B, the optical connector 30B functions as a receptacle provided to the housing of the electronic device 100. The optical connector 30B is configured in a manner similar to the optical connector 10B illustrated in FIG. 5, and thus any corresponding part is denoted by the same reference sign, and detailed description thereof will be omitted.

Figure 13:
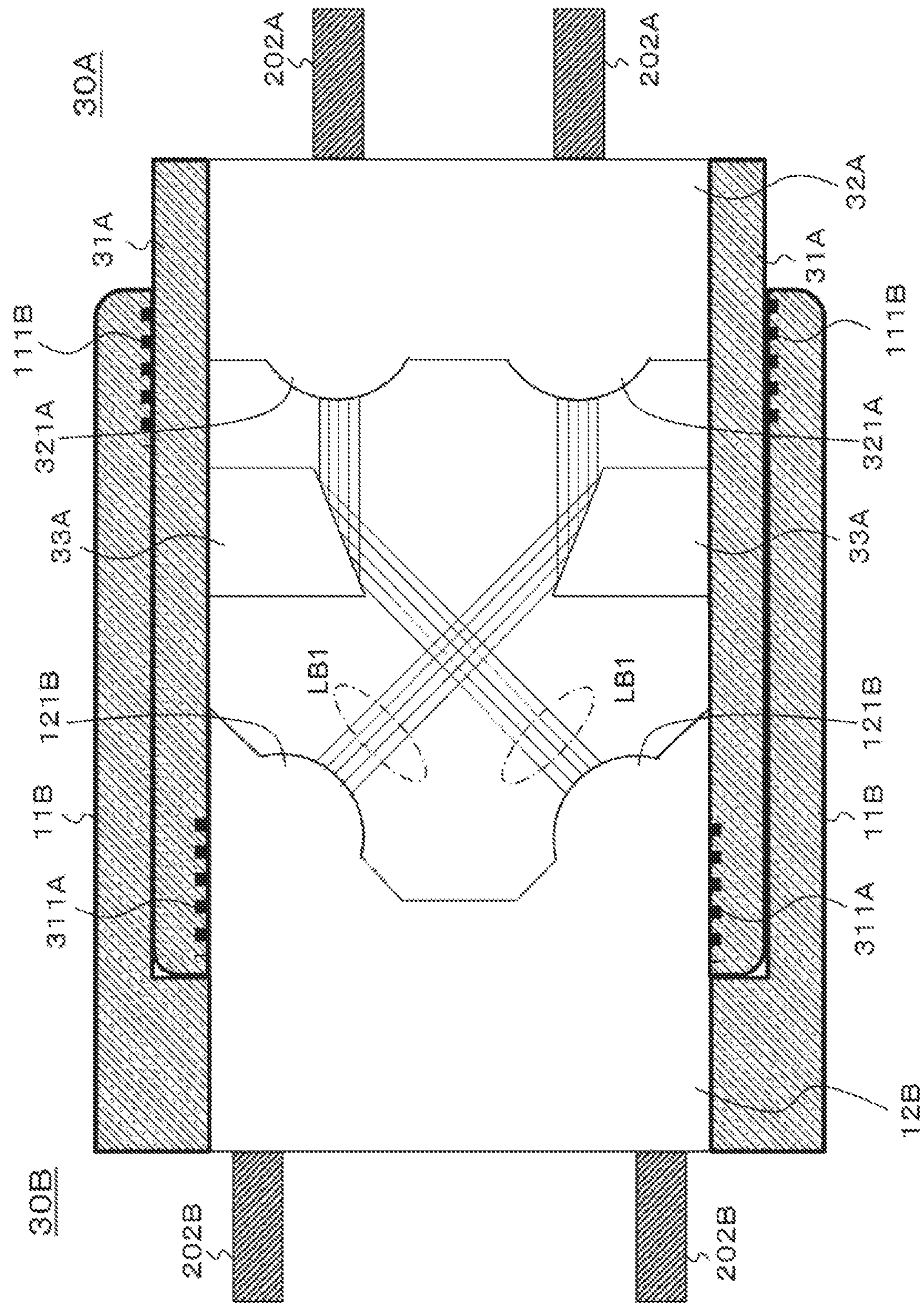
FIG. 13 is a diagram illustrating a state in which the optical connector that functions as a plug is connected with the optical connector that functions as a receptacle.

FIG. 13 illustrates a state in which the optical connector 30A is inserted into the optical connector 30B and the optical connectors 30A and 30B are connected with each other. In this case, the reflection surface of the mirror structural body 33A of the optical connector 30A and the lens 121B of the optical connector 30B face each other, and collimated light (laser beam) emitted from the lens of one of the optical connectors is reflected by the mirror structural body 33A and incident on the lens of the other optical connector, thereby performing optical signal transmission.

In the example illustrated in the drawing, for example, the lens 121B of the optical connector 30B functions as a light emission portion, and the lens 321A of the optical connector 30A functions as a light incident portion. The collimated light LB1 emitted from the lens 121B mounted on the lower side in the optical connector 30B in the drawing is reflected by the mirror structural body 33A disposed on the upper side in the optical connector 30A in the drawing, and incident on the lens 321A mounted on the upper side in the optical connector 30A in the drawing. Furthermore, the collimated light LB1 emitted from the lens 121B mounted on the upper side in the optical connector 30B in the drawing is reflected by the mirror structural body 33A disposed on the lower side in the optical connector 30A in the drawing, and incident on the lens 321A mounted on the lower side in the optical connector 30A in the drawing.

Note that similar description applies to an example in which the lens 321A of the optical connector 30A functions as a light emission portion and the lens 121B of the optical connector 30B functions as a light incident portion. Furthermore, similar description applies to an example in which part of a plurality of lenses 321A of the optical connector 30A functions as a light emission portion and the other part thereof functions as a light incident portion, whereas part of a plurality of lenses 121B of the optical connector 30B functions as a light incident portion and the other part thereof functions as the light emission portion.

As described above, in the optical connectors 30A and 30B illustrated in FIGS. 11 and 12, at least part of collimated light (laser beam) emitted from the lenses 321A and 121B as light emission portions at disconnection is incident on the light diffusion portions 311A and 111B inside the connector exteriors 31A and 11B and diffused, and thus light intensity sufficiently decreases in a distance defined by safety criteria and satisfies the safety criteria. Accordingly, the optical connectors 30A and 30B can prevent laser hazard at disconnection (removal) with a simple structure.

Note that, in the above description, the optical connector 30A functioning as a plug includes the mirror structural body 33A, and the optical connector 30B functioning as a receptacle includes no mirror structural body. However, the optical connector 30A functioning as a plug may include no mirror structural body, and the optical connector 30B functioning as a receptacle may include a mirror structural body.

"Another Exemplary Configuration of Optical Connector that Functions as Plug or Receptacle"

Figure 14:
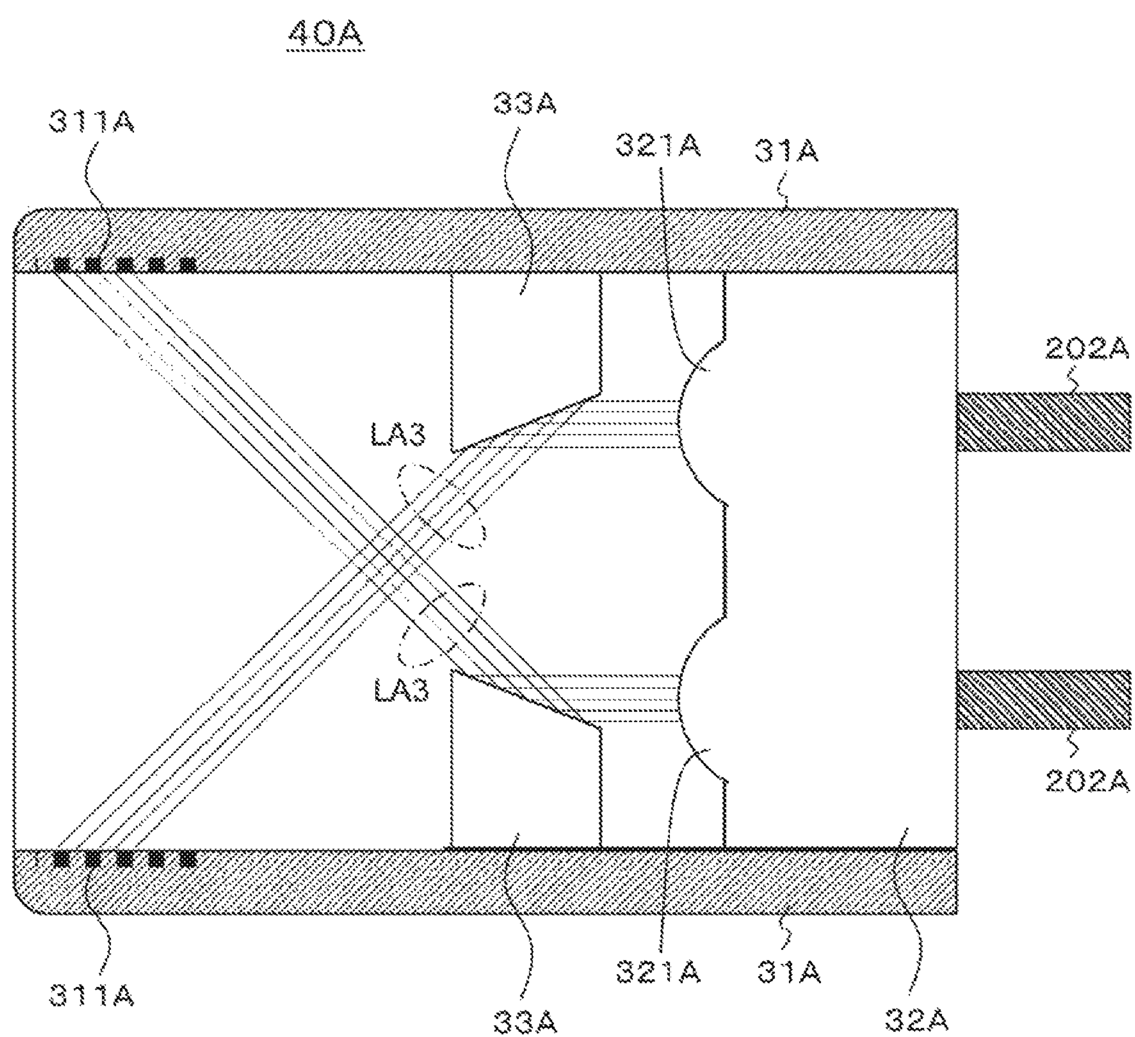
FIG. 14 is a cross-sectional view illustrating an exemplary configuration of the optical connector that functions as a plug.

FIG. 14 illustrates an exemplary configuration of an optical connector 40A. Similarly to the above-described optical connector 10A, the optical connector 40A functions as a plug provided at the end part of the optical cable body 201. The optical connector 40A is configured in a manner similar to the optical connector 30B illustrated in FIG. 11, and thus any corresponding part is denoted by the same reference sign, and detailed description thereof will be omitted.

Figure 15:
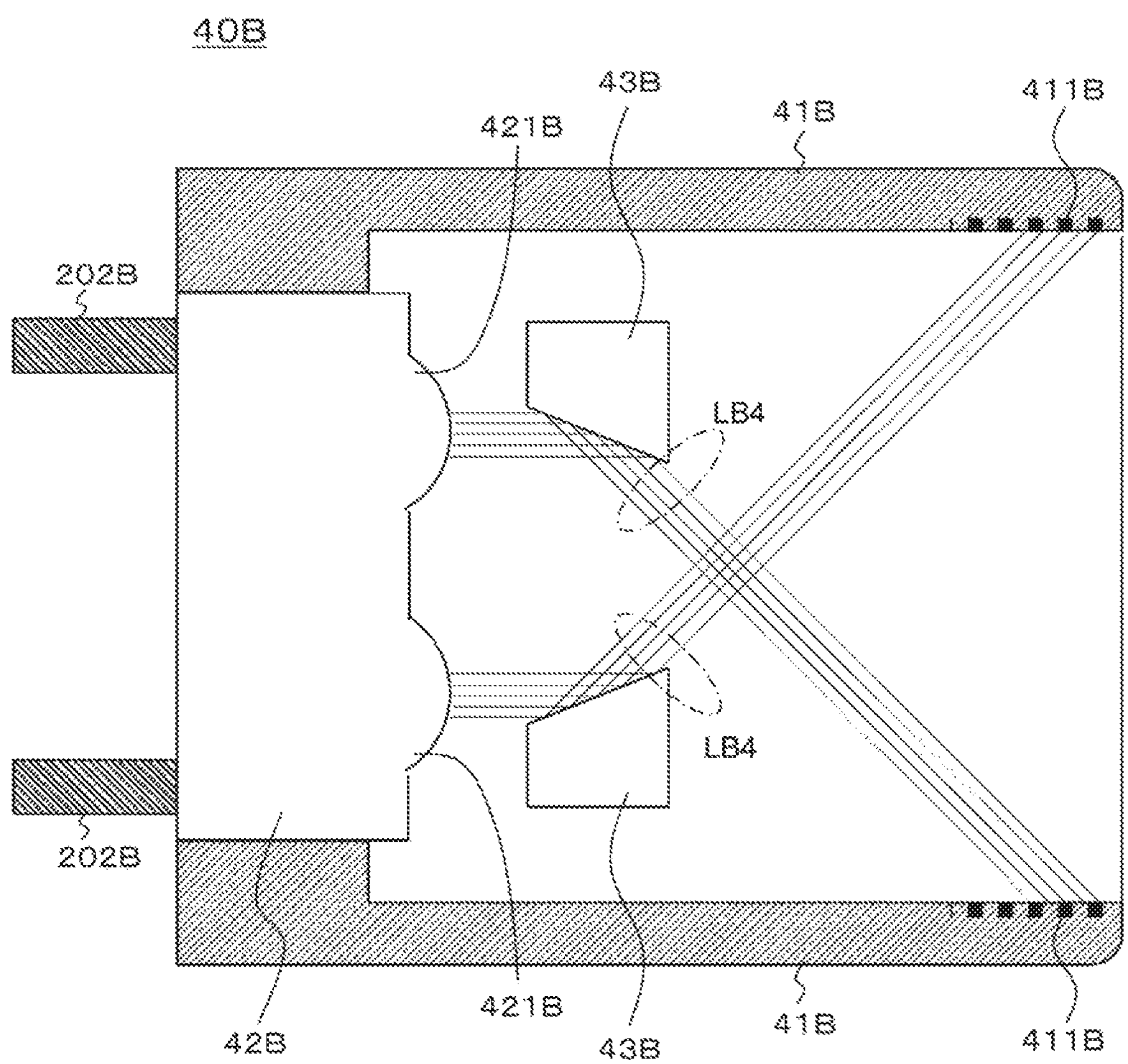
FIG. 15 is a cross-sectional view illustrating an exemplary configuration of the optical connector that functions as a receptacle.

FIG. 15 illustrates an exemplary configuration of an optical connector 40B. Similarly to the above-described optical connector 10B, the optical connector 40B functions as a receptacle provided to the housing of the electronic device 100. The optical connector 40B includes a tubular connector exterior 41B, a block 42B on which a lens 421B is mounted, and a mirror structural body 43B.

The block 42B is incorporated on one end side of the connector exterior 41B. The lens 421B is mounted toward the other end side of the connector exterior 41B. The lens 421B is mounted on the block 42B so that the optical axis direction thereof aligns with the longitudinal direction of the connector exterior 41B. The lens 421B functions as a light emission portion in a case where an optical signal is transmitted therethrough, and the lens 421B functions as a light incident portion in a case where an optical signal is received therethrough.

Note that the two lenses 421B are illustrated in the drawing, but the present technology is not limited to the configuration in the drawing, and lenses 421B in an optional number equal to or larger than one may be mounted on the block 42B in accordance with the number of light transmission paths 202B. For example, a lens array of lenses arrayed in the thickness direction (up-down direction in the drawing)

and the width direction (direction perpendicular to the sheet of the drawing) of the optical connector 40B may be mounted on the block 42B.

In the case of functioning as a light emission portion, the lens 421B collimates and emits light (laser beam) output from the light transmission path 202B. Furthermore, in the case of functioning as a light incident portion, the lens 421B condenses incident collimated light (laser beam) and inputs the light to the light transmission path 202B.

The mirror structural body 43B is disposed on the other end side corresponding to each lens 421B mounted on the block 42B. Note that, in the example illustrated in the drawing, the mirror structural body 43B achieves mirrored reflection, but the present technology is not limited thereto, and the mirror structural body 43B may be, for example, a reflection structure such as a concave mirror.

In a case where the lens 421B functions as a light emission portion, the mirror structural body 43B reflects, to the inside at an appropriate angle, collimated light (laser beam) emitted from the lens 421B in the longitudinal direction of the connector exterior 41B, and changes the direction thereof to a direction tilted relative to the longitudinal direction of the connector exterior 41B. Furthermore, in a case where the lens 421B functions as a light incident portion, the mirror structural body 43B reflects collimated light (laser beam) from a direction tilted relative to the longitudinal direction of the connector exterior 41B so that the collimated light is incident on the lens 421B, and changes the direction thereof to the longitudinal direction of the connector exterior 41B.

The connector exterior 41B has such a length that at least part of collimated light (laser beam) LB4 emitted from the lens 421B functioning as the emission portion and reflected by the mirror structural body 43B is incident on the inside (inner wall) thereof. Specifically, in this case, at least part of the collimated light LB4 emitted from the lens 421B and reflected by the mirror structural body 43B is incident on the inside (inner wall) of the connector exterior 41B and diffused. In the example illustrated in the drawing, the whole light is incident on the inside. Accordingly, laser hazard is prevented.

A light diffusion portion 411B is formed at a site of the connector exterior 41B on which collimated light is incident. The light diffusion portion 411B may be any member that diffuses light and may be, for example, a rough surface or a porous film such as an alumite layer. An alumite layer can be easily and inexpensively formed and has an excellent light diffusion property. In a case where the light diffusion portion 411B is an alumite layer, the connector exterior 41B includes aluminum.

Figure 16:
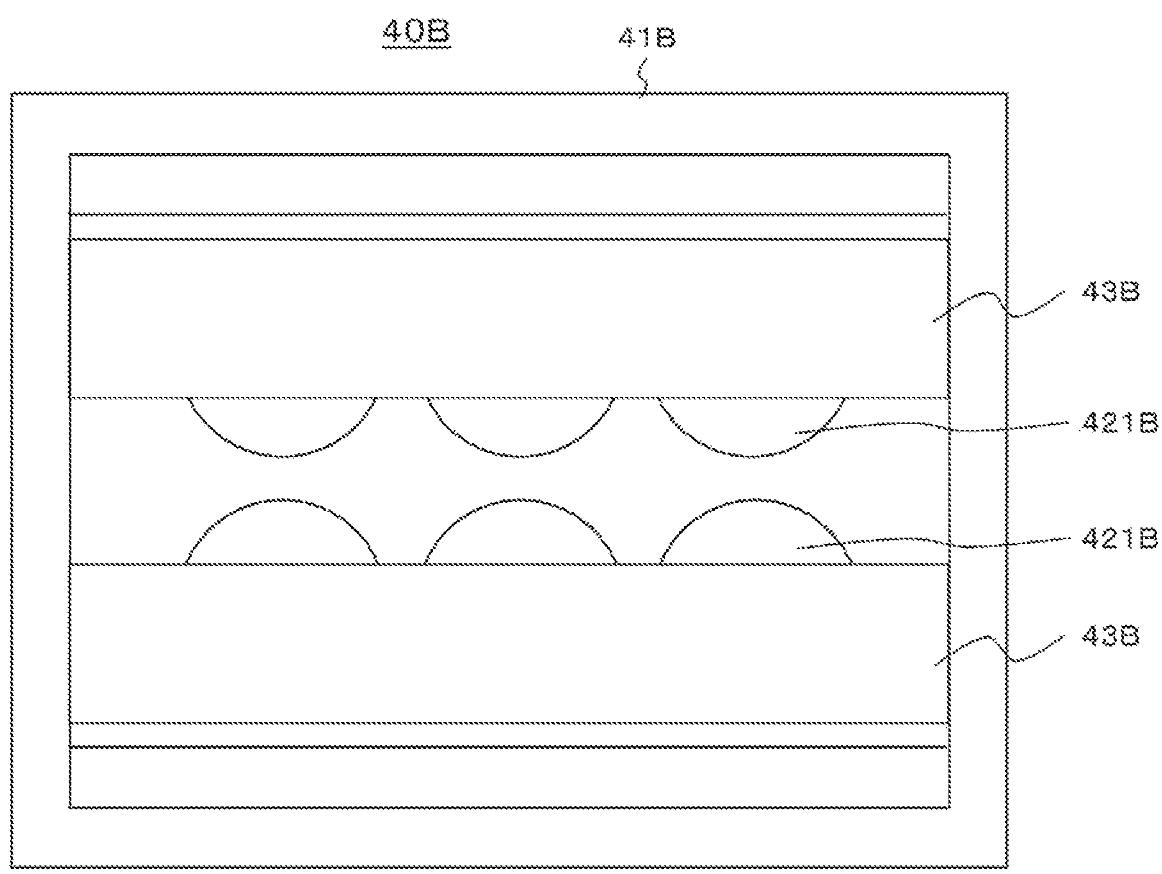
FIG. 16 is a front view of the optical connector that functions as a receptacle seen from an opening side.

FIG. 16 illustrates a front view of the optical connector 40B seen from the opening side. Two end parts of the mirror structural body 43B in the width direction (right and left direction in the drawing) are fixed to the connector exterior 41B.

Figure 17:
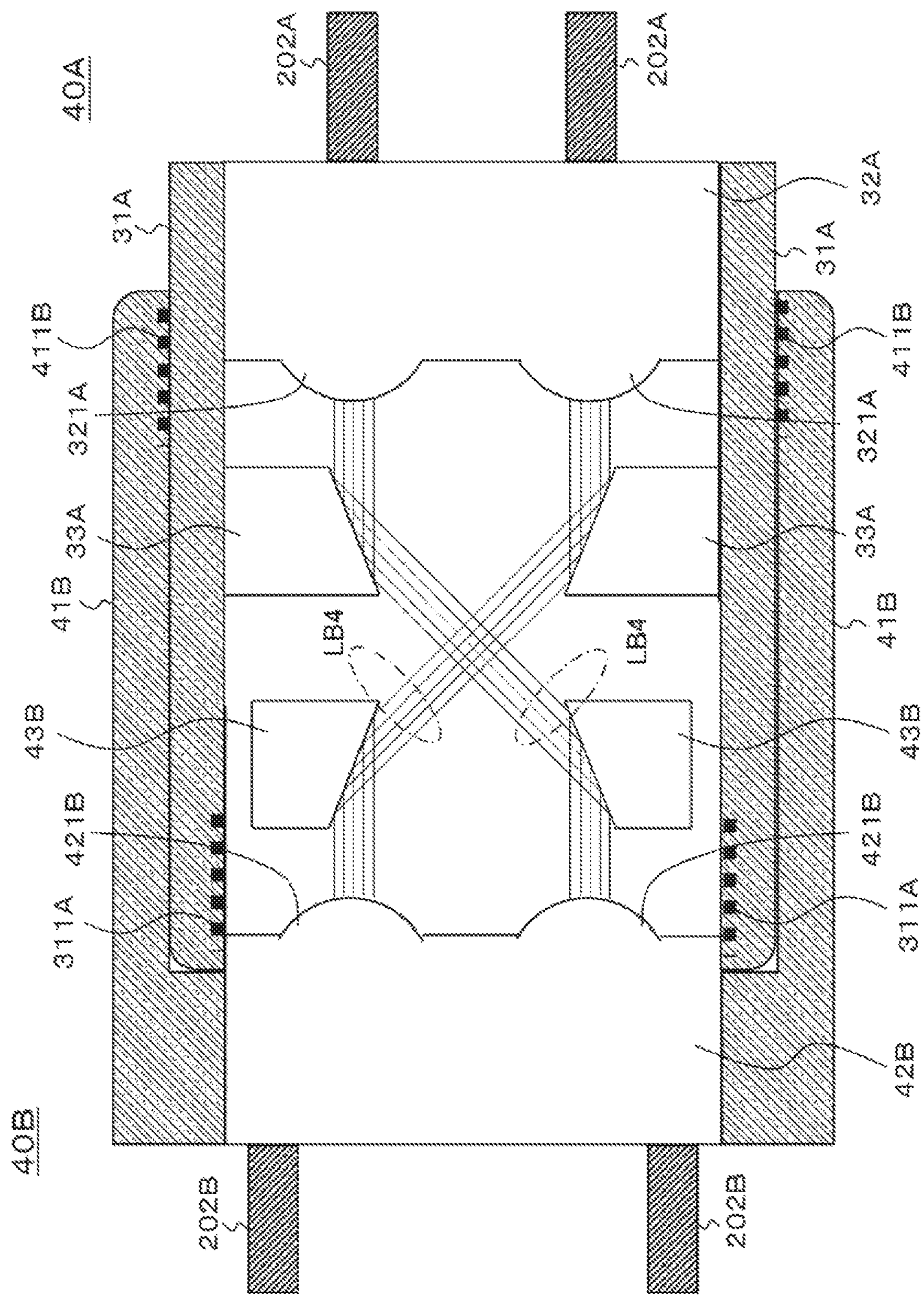
FIG. 17 is a diagram illustrating a state in which the optical connector that functions as a plug is connected with the optical connector that functions as a receptacle.

FIG. 17 illustrates a state in which the optical connector 40A is inserted into the optical connector 40B and the optical connectors 40A and 40B are connected with each other. In this case, the reflection surface of the mirror structural body 43B of the optical connector 40B and the reflection surface of the mirror structural body 33A of the optical connector 40A face each other, and collimated light (laser beam) emitted from the lens of one of the optical connectors is reflected by the two mirror structural bodies and incident on the lens of the other optical connector, thereby performing optical signal transmission.

In the example illustrated in the drawing, for example, the lens 421B of the optical connector 40B functions as a light emission portion, and the lens 321A of the optical connector 40A functions as a light incident portion. The collimated light LB4 emitted from the lens 421B mounted on the lower side in the optical connector 40B in the drawing is reflected by the mirror structural body 43B disposed on the lower side in the optical connector 40B in the drawing, further reflected by the mirror structural body 33A disposed on the upper side in the optical connector 40A in the drawing, and incident on the lens 321A mounted on the upper side in the optical connector 40A in the drawing.

Furthermore, the collimated light LB4 emitted from the lens 421B mounted on the upper side in the optical connector 40B in the drawing is reflected by the mirror structural body 43B disposed on the upper side in the optical connector 40B in the drawing, further reflected by the mirror structural body 33A disposed on the lower side in the optical connector 40A in the drawing, and incident on the lens 321A mounted on the lower side in the optical connector 40A in the drawing.

Note that similar description applies to an example in which the lens 321A of the optical connector 40A functions as a light emission portion and the lens 421B of the optical connector 40B functions as a light incident portion. Furthermore, similar description applies to an example in which part of a plurality of lenses 321A of the optical connector 40A functions as a light emission portion and the other part thereof functions as a light incident portion, whereas part of a plurality of lenses 421B of the optical connector 40B functions as a light incident portion and the other part thereof functions as the light emission portion.

As described above, in the optical connectors 40A and 40B illustrated in FIGS. 14 and 15, at least part of collimated light (laser beam) emitted from the lenses 321A and 421B as light emission portions at disconnection is incident on the light diffusion portions 311A and 411B inside the connector exteriors 31A and 41B and diffused, and thus light intensity sufficiently decreases in a distance defined by safety criteria and satisfies the safety criteria. Accordingly, the optical connectors 40A and 40B can prevent laser hazard at disconnection (removal) with a simple structure.

2. Exemplary Application

The technology according to an embodiment of the present disclosure is applicable to various products. For example, the technology according to an embodiment of the present disclosure may be achieved as a device mounted on any kinds of moving objects such as an automobile, an electric vehicle, a hybrid electric vehicle, a motorcycle, a bicycle, a personal mobility, an airplane, a drone, a ship, a robot, a construction machine, and an agriculture machine (tractor).

Figure 18:
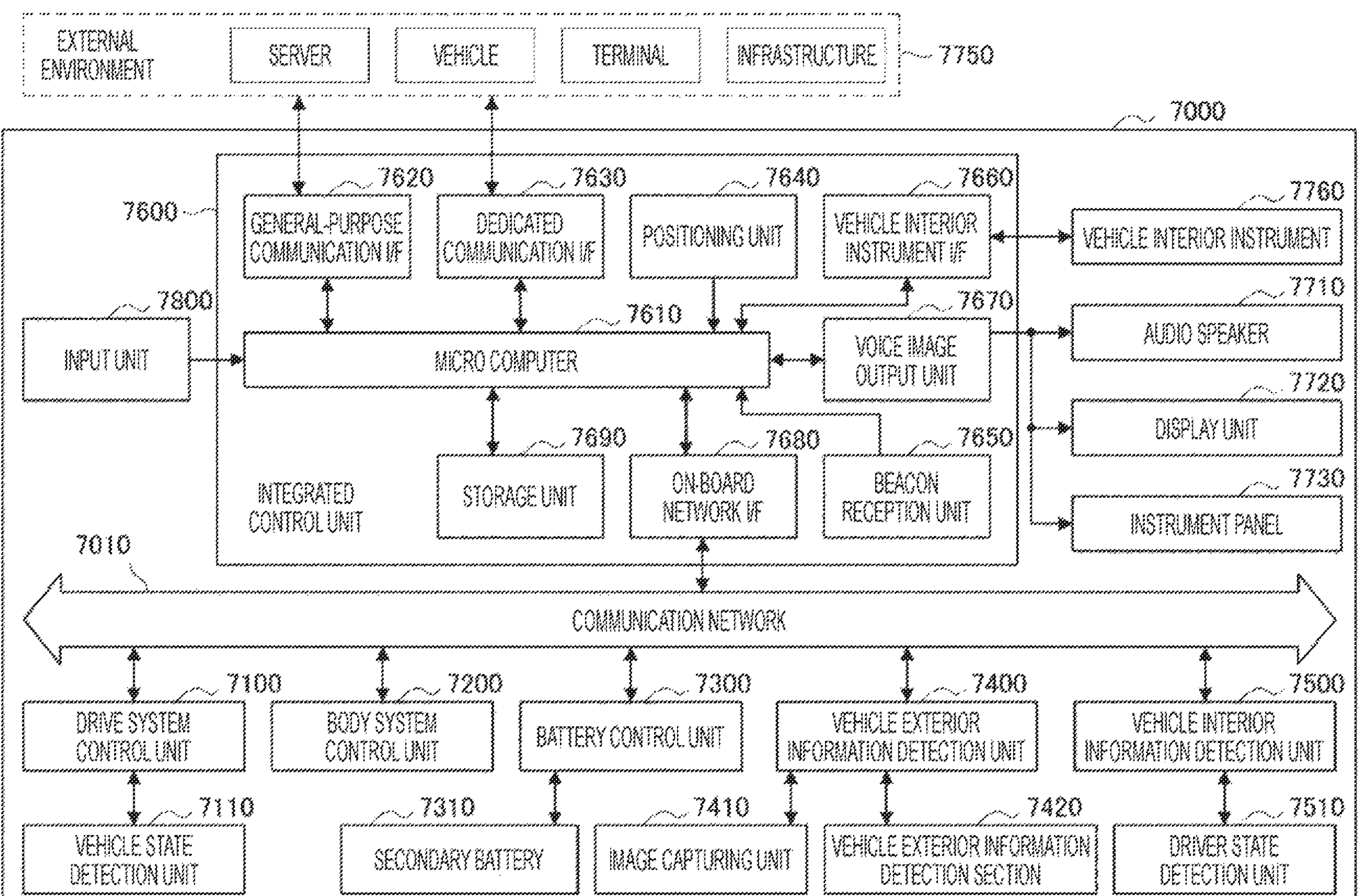
FIG. 18 is a block diagram illustrating a schematic exemplary configuration a vehicle control system.

FIG. 18 is a block diagram illustrating an exemplary schematic configuration of a vehicle control system 7000 as an exemplary moving object control system to which the technology according to an embodiment of the present disclosure is applicable. The vehicle control system 7000 includes a plurality of electronic control units connected with each other through a communication network 7010. In the example illustrated in FIG. 18, the vehicle control system 7000 includes a drive system control unit 7100, a body system control unit 7200, a battery control unit 7300, a vehicle exterior information detection unit 7400, a vehicle interior information detection unit 7500, and an integration control unit 7600. The communication network 7010 connecting these plurality of control units may be an on-board communication network compliant with an optional standard such as a controller area network (CAN), a local interconnect network (LIN), a local area network (LAN), or a FlexRay (registered trademark).

Each control unit includes a microcomputer configured to perform arithmetic processing in accordance with various computer programs, a storage unit configured to store, for example, computer programs executed by the microcomputer and parameters used for various calculations, and a drive circuit configured to drive various kinds of control target devices. Each control unit includes a network I/F for performing communication with another control unit through the communication network 7010, and a communication I/F for performing communication with a device, sensor, or the like in or out of a vehicle through wired communication or wireless communication. FIG. 18 illustrates, as functional configurations of the integration control unit 7600, a microcomputer 7610, a general-purpose communication I/F 7620, a dedicated communication I/F 7630, a positioning unit 7640, a beacon reception unit 7650, a vehicle interior instrument I/F 7660, a voice image output unit 7670, an on-board network I/F 7680, and a storage unit 7690. Similarly, any other control unit includes a microcomputer, a communication I/F, a storage unit, and the like.

The drive system control unit 7100 controls device operations related to the drive system of a vehicle in accordance with various computer programs. For example, the drive system control unit 7100 functions as a control device of, for example, a drive power generation device such as an internal combustion or a drive motor configured to generate drive power of the vehicle, a drive power transmission mechanism configured to transfer the drive power to wheels, a steering mechanism configured to adjust the angle of the vehicle, and a braking device configured to generate braking force of the vehicle. The drive system control unit 7100 may have the function of a control device of, for example, an antilock brake system (ABS) or an electronic stability control (ESC).

The drive system control unit 7100 is connected with a vehicle state detection unit 7110. The vehicle state detection unit 7110 includes, for example, a gyro sensor configured to detect the angular velocity of axial rotation motion of the vehicle body, an acceleration sensor configured to detect acceleration of the vehicle, and at least one of sensors configured to detect, for example, the operation amount of the acceleration pedal, the operation amount of the brake pedal, the steering angle of the steering wheel, the engine rotation speed, and the rotational speed of the wheels. The drive system control unit 7100 performs arithmetic processing by using a signal input from the vehicle state detection unit 7110, and controls an internal combustion, a drive motor, an electric power steering device, a brake device, and the like.

The body system control unit 7200 controls operations of various devices mounted on the vehicle body in accordance with various computer programs. For example, the body system control unit 7200 functions as a control device of a keyless entry system, a smart key system, a power window device, and various lamps such as a head lamp, a back lamp, a brake lamp, an indicator, and a fog lamp. In this case, the body system control unit 7200 may receive radio wave emitted by a portable device that substitutes for a key or various switch signals. The body system control unit 7200 receives inputting of the radio wave or signals and controls a door lock device, a power window device, a lamp, and the like of the vehicle.

The battery control unit 7300 controls a secondary battery 7310 as an electrical power supply source of the drive motor in accordance with various computer programs. For example, the battery control unit 7300 receives information such as the battery temperature, the battery output voltage, or the battery remaining capacity from a battery device including the secondary battery 7310. The battery control unit 7300 performs arithmetic processing by using these signals, and controls adjustment of the temperature of the secondary battery 7310, or controls a cooling device or the like included in the battery device.

The vehicle exterior information detection unit 7400 detects information regarding the outside of the vehicle on which the vehicle control system 7000 is mounted. For example, the vehicle exterior information detection unit 7400 is connected with at least one of an image capturing unit 7410 or a vehicle exterior information detection section 7420. The image capturing unit 7410 includes at least one of a time of flight (ToF) camera, a stereo camera, a single-lens camera, an infrared camera, or any other camera. The vehicle exterior information detection section 7420 includes, for example, at least one of an environment sensor for detecting current weather or climate or a circumference information detection sensor for detecting any other vehicle, an obstacle, a pedestrian, or the like around the vehicle on which the vehicle control system 7000 is mounted.

The environment sensor may be, for example, at least one of a raindrop sensor configured to detect rain, a mist sensor configured to detect mist, a sunshine sensor configured to detect the degree of sunshine, or a snowflake sensor configured to detect snowfall. The circumference information detection sensor may be at least one of an ultrasonic sensor, a radar device, or a light detection and ranging, laser imaging detection and ranging (LIDAR) device. These image capturing unit 7410 and the vehicle exterior information detection section 7420 may be provided as independent sensors or devices, or may be provided as devices in which a plurality of sensors or devices are integrated.

Figure 19:
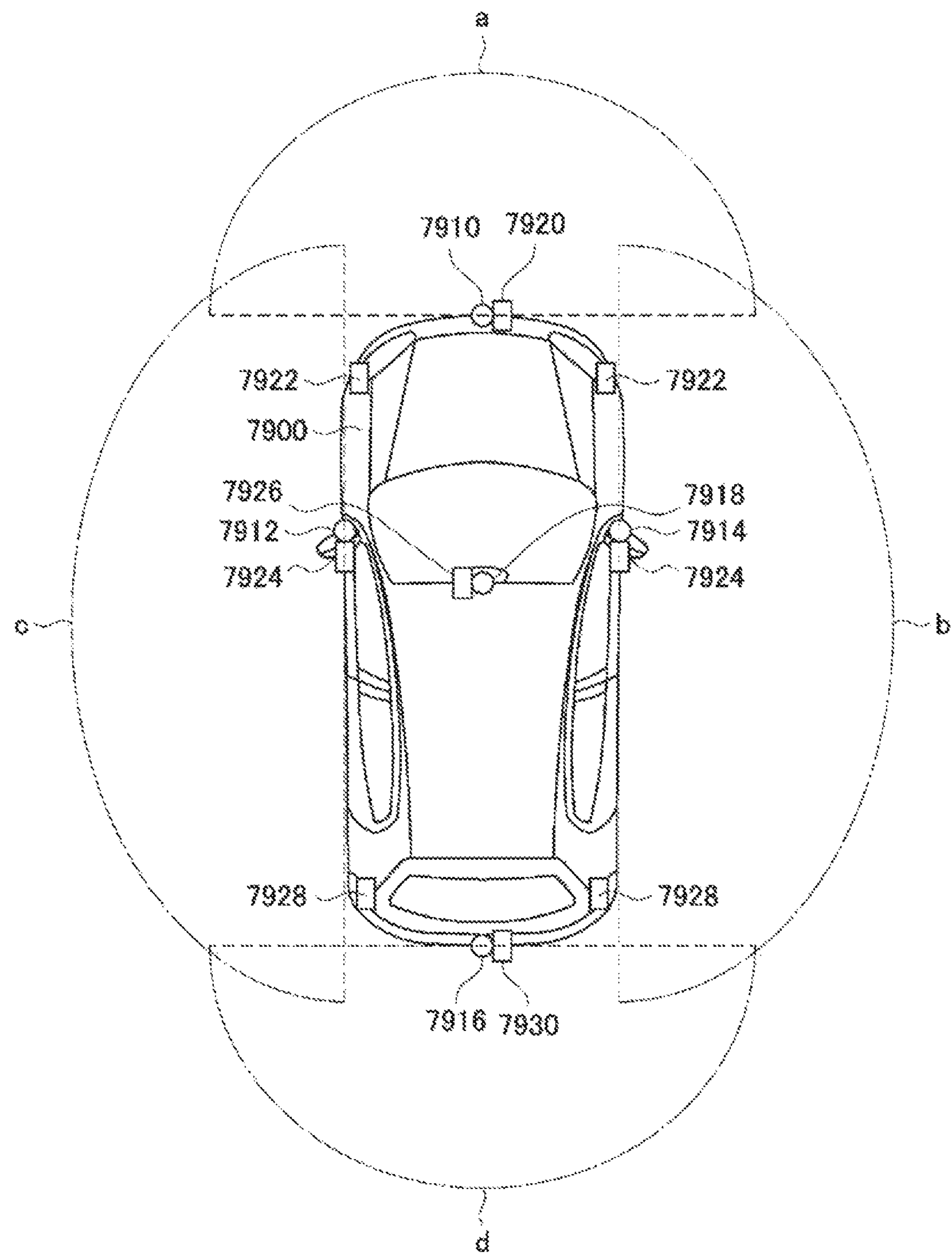
FIG. 19 is an explanatory diagram illustrating exemplary installation positions of a vehicle exterior information detection section and an image capturing unit.

Here, FIG. 19 illustrates exemplary installation positions of the image capturing unit 7410 and the vehicle exterior information detection section 7420. The image capturing units 7910, 7912, 7914, 7916, and 7918 are provided at, for example, at least one of the positions of the front nose, the side mirrors, the rear bumper, and the backdoor of a vehicle 7900, or an upper part of the windshield inside of the vehicle. The image capturing unit 7910 provided to the front nose and the image capturing unit 7918 provided to the upper part of the windshield inside the vehicle mainly acquire images on the front side of the vehicle 7900. The image capturing units 7912 and 7914 provided to the side mirrors mainly acquire images on sides of the vehicle 7900. The image capturing unit 7916 provided to the rear bumper or the backdoor mainly acquires an image on the back side of the vehicle 7900. The image capturing unit 7918 provided to the upper part of the windshield inside the vehicle is mainly used to detect, for example, a preceding vehicle, a pedestrian, an obstacle, a traffic light, a traffic sign, and a lane.

Note that FIG. 19 illustrates exemplary image capturing ranges of the image capturing units 7910, 7912, 7914, and 7916. An image capturing range a indicates the image capturing range of the image capturing unit 7910 provided to the front nose, image capturing ranges b and c indicate the image capturing ranges of the image capturing units 7912 and 7914 provided to the side mirrors, respectively, and an image capturing range d indicates the image capturing range of the image capturing unit 7916 provided to the rear bumper or the backdoor. For example, image data captured by the image capturing units 7910, 7912, 7914, and 7916 is placed over to obtain a bird's-eye view image of the vehicle 7900 seen from above.

Vehicle exterior information detection sections 7920, 7922, 7924, 7926, 7928, and 7930 provided at front, rear, sides, and corners of the vehicle 7900, and an upper part of the windshield inside the vehicle may be, for example, an ultrasonic wave sensor or a radar device. The vehicle exterior information detection sections 7920, 7926, 7928, and 7930 provided at the front nose, the rear bumper, and the backdoor of the vehicle 7900, and the upper part of the windshield inside the vehicle may be, for example, a LIDAR device. These vehicle exterior information detection sections 7920 to 7930 are mainly used for detection of a preceding vehicle, a pedestrian, an obstacle, and the like.

The description continues returning to FIG. 18. The vehicle exterior information detection unit 7400 causes the image capturing unit 7410 to capture an exterior image and receives the captured image data. In addition, the vehicle exterior information detection unit 7400 receives detection information from the vehicle exterior information detection section 7420 connected therewith. In a case where the vehicle exterior information detection section 7420 is an ultrasonic wave sensor, a radar device, or a LIDAR device, the vehicle exterior information detection unit 7400 emits, for example, ultrasonic wave or electromagnetic wave, and receives information of received reflected wave. The vehicle exterior information detection unit 7400 may perform, on the basis of the received information, object detection processing or distance detection processing of a person, a car, an obstacle, a sign, a character on a road surface, and the like. The vehicle exterior information detection unit 7400 may perform, on the basis of the received information, environment recognition processing of recognizing rainfall, fog, a road surface status, and the like. The vehicle exterior information detection unit 7400 may calculate the distance to an exterior object on the basis of the received information.

In addition, the vehicle exterior information detection unit 7400 may perform, on the basis of the received image data, image recognition processing or distance detection processing of recognizing a person, a car, an obstacle, a sign, a character on a road surface, and the like. The vehicle exterior information detection unit 7400 may perform processing such as distortion correction or positioning on the received image data, and may synthesize the image data with image data captured by another image capturing unit 7410 to generate a bird's-eye view image or a panoramic image. The vehicle exterior information detection unit 7400 may perform viewpoint conversion processing by using image data captured by another image capturing unit 7410.

The vehicle interior information detection unit 7500 detects vehicle interior information. The vehicle interior information detection unit 7500 is connected with, for example, a driver state detection unit 7510 configured to detect the state of the driver. The driver state detection unit 7510 may include, for example, a camera configured to capture an image of the driver, a living body sensor configured to detect living body information of the driver, or a microphone configured to collect interior voice. The living body sensor is provided to, for example, a seat surface, the steering wheel, or the like, and detects living body information of a passenger sitting on the seat or the driver holding the steering wheel. On the basis of detection information input from the driver state detection unit 7510, the vehicle interior information detection unit 7500 may calculate the fatigue degree or concentration degree of the driver or may determine whether or not the driver is asleep. The vehicle interior information detection unit 7500 may perform processing such as noise canceling processing on a collected voice signal.

The integration control unit 7600 controls the entire operation in the vehicle control system 7000 in accordance with various computer programs. The integration control unit 7600 is connected with an input unit 7800. The input unit 7800 is achieved by a device, such as a touch panel, a button, a microphone, a switch, or a lever, through which an input operation can be performed by a passenger. The integration control unit 7600 may receive data acquired through voice recognition of voice input through a microphone. The input unit 7800 may be, for example, a remote control device using infrared or other radio wave, or an external connection instrument such as a cellular phone or a personal digital assistant (PDA) capable of operating according to the vehicle control system 7000. The input unit 7800 may be, for example, a camera, which allows the passenger to input information through gesture. Alternatively, data obtained by detecting motion of a wearable device worn by the passenger may be input. Furthermore, the input unit 7800 may include, for example, an input control circuit or the like configured to generate an input signal on the basis of information input by a passenger or the like through the above-described input unit 7800 and output the input signal to the integration control unit 7600. The passenger or the like operates the input unit 7800 to input various kinds of data or give an instruction for a processing operation to the vehicle control system 7000.

The storage unit 7690 may include a read only memory (ROM) configured to store various computer programs executed by the microcomputer 7610, and a random access memory (RAM) configured to store, for example, various parameters, calculation results, or sensor values. In addition, the storage unit 7690 may be achieved by, for example, a magnetic storage device such as a hard disc drive (HDD), a semiconductor storage device, an optical storage device, or a magneto-optical storage device.

The general-purpose communication I/F 7620 is a general-purpose communication I/F configured to mediate communication with various instruments present in an external environment 7750. The general-purpose communication I/F 7620 may implement a cellular communication protocol such as global system of mobile communications (GSM), WiMAX, long term evolution (LTE) or LTE-advanced (LTE-A), or any other wireless communication protocol of wireless LAN (also referred to as Wi-Fi (registered trademark)), Bluetooth (registered trademark), or the like. The general-purpose communication I/F 7620 may be connected with an instrument (for example, an application server or a control server) on an external network (for example, the Internet, a cloud network, or a network unique to a business operator) through a base station or an access point, for example. In addition, the general-purpose communication I/F 7620 may be connected with a terminal (for example, a terminal of a driver, a pedestrian, or a shop, or a machine type communication (MTC) terminal) near the vehicle by using, for example, a peer-to-peer (P2P) technology.

The dedicated communication I/F 7630 is a communication I/F that supports a communication protocol formulated for use in a vehicle. The dedicated communication I/F 7630 may implement a standard protocol such as wireless access in vehicle environment (WAVE), dedicated short range communications (DSRC), or cellular communication protocol as combination of IEEE802.11p of the lower-level layer and IEEE1609 of the higher-level layer. The dedicated communication I/F 7630 typically performs V2X communication as a concept including one or more of vehicle-to-vehicle communication, vehicle-to-infrastructure communication, vehicle-to-home communication, and vehicle-to-pedestrian communication.

The positioning unit 7640 receives, for example, global navigation satellite system (GNSS) signals from GNSS satellites (for example, global positioning system (GPS) signals from GPS satellites), executes positioning, and generates position information including the latitude, longitude, and altitude of the vehicle. Note that the positioning unit 7640 may specify the current position through signal interchange with a wireless access point, or may acquire position information from a terminal such as a cellular phone, a PHS, or a smartphone having a positioning function.

The beacon reception unit 7650 receives, for example, radio wave or electromagnetic wave emitted from a wireless station or the like installed on a road, and acquires information such as the current position, a traffic jam, a road closing, or a required traveling time. Note that the function of the beacon reception unit 7650 may be included in the dedicated communication I/F 7630 described above.

The vehicle interior instrument I/F 7660 is a communication interface configured to mediate connection between the microcomputer 7610 and various vehicle interior instruments 7760 in the vehicle. The vehicle interior instrument I/F 7660 may establish wireless connection by using a wireless communication protocol such as wireless LAN, Bluetooth (registered trademark), near field communication (NFC), or wireless USB (WUSB). Furthermore, the vehicle interior instrument I/F 7660 may establish wired connection such as universal serial bus (USB), high-definition multimedia interface (HDMI), or mobile high-definition link (MHL) through a connection terminal (not illustrated) (and a cable, as needed). The vehicle interior instruments 7760 may include, for example, at least one of a mobile device or a wearable instrument owned by a passenger, or an information instrument conveyed into or attached to the vehicle. In addition, the vehicle interior instruments 7760 may include a navigation device configured to search for a path to an optional destination. The vehicle interior instrument I/F 7660 exchanges a control signal or a data signal with the vehicle interior instruments 7760.

The on-board network I/F 7680 is an interface configured to mediate communication between the microcomputer 7610 and the communication network 7010. The on-board network I/F 7680 communicates a signal or the like according to a predetermined protocol supported by the communication network 7010.

The microcomputer 7610 of the integration control unit 7600 controls the vehicle control system 7000 in accordance with various computer programs on the basis of information acquired through at least one of the general-purpose communication I/F 7620, the dedicated communication I/F 7630, the positioning unit 7640, the beacon reception unit 7650, the vehicle interior instrument I/F 7660, or the on-board network I/F 7680. For example, the microcomputer 7610 may calculate a control target value of a drive power generation device, a steering mechanism, or a braking device on the basis of acquired interior and exterior information, and may output a control command to the drive system control unit 7100. For example, the microcomputer 7610 may perform cooperative control to implement the function of an advanced driver assistance system (ADAS) including, for example, collision avoidance or impact reduction of the vehicle, following travel based on the inter-vehicular distance, vehicle speed maintaining travel, vehicle collision warning, or vehicle lane deviation warning. In addition, the microcomputer 7610 may perform cooperative control to achieve, for example, automated driving in which the vehicle autonomously travels independently from an operation by the driver, by controlling the drive power generation device, the steering mechanism, the braking device, and the like on the basis of acquired information around the vehicle.

The microcomputer 7610 may generate information regarding the three-dimensional distance between the vehicle and a surrounding object such as a structure or a person on the basis of information acquired through at least one of the general-purpose communication I/F 7620, the dedicated communication I/F 7630, the positioning unit 7640, the beacon reception unit 7650, the vehicle interior instrument I/F 7660, or the on-board network I/F 7680, and may produce local map information including information around the current position of the vehicle. Furthermore, the microcomputer 7610 may predict danger such as collision of the vehicle, approaching of a pedestrian or the like, or entry to a closed road on the basis of the acquired information, and may generate a warning signal. The warning signal may be, for example, a signal for generating warning sound or turning on a warning lamp.

The voice image output unit 7670 transmits at least one of a voice output signal or an image output signal to an output device capable of visually or audibly notifying a passenger in the vehicle or the outside of the vehicle of information. In the example illustrated in FIG. 18, the output device is an audio speaker 7710, a display unit 7720, and an instrument panel 7730. The display unit 7720 may include, for example, at least one of an on-board display or a head-up display. The display unit 7720 may have an augmented reality (AR) display function. The output device may be, other than these devices, another device including a wearable device such as a headphone or a spectacle display worn by the passenger, a projector, a lamp, or the like. In a case where the output device is a display device, the display device visually displays a result obtained through various kinds of processing performed by the microcomputer 7610 or information received from another control unit, in various formats of text, image, table, graph, and the like. In addition, in a case where the output device is a sound output device, the sound output device converts an audio signal including, for example, played-back voice data or acoustic data into an analog signal, and audibly outputs the signal.

Note that, in the example illustrated in FIG. 18, at least two control units connected with each other through the communication network 7010 may be integrated as one control unit. Alternatively, an individual control unit may include a plurality of control units. Furthermore, the vehicle control system 7000 may include another control unit (not illustrated). In addition, part or all of the function of any control unit in the above description may be achieved by another control unit. In other words, predetermined arithmetic processing may be performed at any control unit as long as information is transmitted and received through the communication network 7010. Similarly, a sensor or a device connected with any control unit may be connected with another control unit, and a plurality of control units may mutually transmit and receive detection information through the communication network 7010.

Note that a computer program for achieving each function of the electronic device 100 according to the present embodiment described with reference to FIGS. 1 and 7 may be mounted on any control unit or the like. Furthermore, a computer-readable recording medium storing such a computer program may be provided. The recording medium is, for example, a magnetic disk, an optical disk, a magneto optical disc, a flash memory, or the like. Furthermore, the above-described computer program may be distributed, for example, through a network without using a recording medium.

In the vehicle control system 7000 described above, the optical connectors 10A to 60A and 10B to 60B described with reference to FIGS. 1 to 17 are applicable to the various interfaces illustrated in FIG. 18. For example, the optical connectors 10A to 60A and 10B to 60B are applicable as communication connectors in the general-purpose communication I/F 7620, the dedicated communication I/F 7630, the vehicle interior instrument I/F 7660, the voice image output unit 7670, the on-board network I/F 7680, the corresponding external environment 7750, the vehicle interior instrument 7760, the audio speaker 7710, the display unit 7720, the instrument panel 7730, the communication network 7010, and the like. Furthermore, an electronic device according to the present disclosure, for example, the electronic device 100 is applicable to, for example, the integration control unit 7600. Further, an optical cable according to the present disclosure, for example, the optical cable 200 is applicable to, in addition to the communication network 7010, connection between interfaces and instruments in and out of the vehicle control system 7000.

Furthermore, at least some of the components of the electronic device 100 described with reference to FIGS. 1 and 7 may be achieved by a module (for example, an integrated circuit module achieved by one die) for the integration control unit 7600 illustrated in FIG. 18. Alternatively, the electronic device 100 described with reference to FIG. 7 may be achieved by a plurality of control units of the vehicle control system 7000 illustrated in FIG. 18.

3. Modification

Preferable embodiments of the present disclosure are described above in detail with reference to the accompanying drawings, but the technical scope of the present disclosure is not limited to such examples. It is clear that those with typical knowledge in the technical field of the present disclosure can conceive various modifications and corrections in the range of the technical idea described in the claims, and it should be understood that these modifications and corrections belong to the technical scope of the present disclosure.

Furthermore, effects described in the present specification are merely illustrative or exemplary but not restrictive. Thus, the technology according to the present disclosure achieves, together with or in place of the above-described effects, any other effect clear to the skilled person in the art on the basis of the description of the present specification.

Note that the technical scope of the present disclosure includes configurations as described below.

(1) An optical connector including:

a tubular connector exterior; and a block that is incorporated on one end side of the connector exterior and in which a light emission portion or a light incident portion is mounted toward the other end side of the connector exterior, in which the light emission portion or the light incident portion is mounted on the block so that an optical axis direction of the light emission portion or the light incident portion is tilted relative to a longitudinal direction of the connector exterior, the light emission portion emits collimated light in accordance with light output from a light transmission path, and at least part of the emitted collimated light is incident on a light diffusion portion provided inside the connector exterior.

(2) The optical connector according to (1), in which the block includes a lens through which the collimated light is emitted.

(3) The optical connector according to (1) or (2), in which the block includes a light direction change member configured to change, to the direction of the tilt, the direction of light output from the light transmission path extending in the longitudinal direction of the connector exterior.

(4) The optical connector according to any one of (1) to (3), in which the block is provided with a maintaining portion that contacts a block of a mating connector to maintain a block interval at a particular distance.

(5) An optical connector including:

a tubular connector exterior; and a block that is incorporated on one end side of the connector exterior and in which a light emission portion or a light incident portion is mounted toward the other end side of the connector exterior, in which the light emission portion or the light incident portion is mounted on the block so that an optical axis direction of the light emission portion or the light incident portion is tilted relative to a longitudinal direction of the connector exterior, and the light incident portion inputs light in accordance with incident collimated light to a light transmission path.

(6) The optical connector according to (5), in which the block includes a lens through which the incident collimated light is condensed.

(7) The optical connector according to (5) or (6), in which the block includes a light direction change member configured to change the direction of the light in accordance with the incident collimated light to the direction of the light transmission path extending in the longitudinal direction of the connector exterior.

(8) An optical connector includes:

a tubular connector exterior; and a block that is incorporated on one end side of the connector exterior and in which a light emission portion or a light incident portion is mounted toward the other end side of the connector exterior, in which the light emission portion or the light incident portion is mounted on the block so that an optical axis direction of the light emission portion or the light incident portion is tilted relative to a longitudinal direction of the connector exterior, the light emission portion emits light condensed in accordance with light output from a light transmission path, and at least part of the emitted light is incident on a light diffusion portion provided inside the connector exterior.

(9) The optical connector according to (8), in which the block includes a lens through which the condensed light is emitted.

(10) The optical connector according to (8) or (9), in which the block includes a light direction change member configured to change, to the direction of the tilt, the direction of light output from the light transmission path extending in the longitudinal direction of the connector exterior.

(11) An optical connector includes:

a tubular connector exterior; and a block that is incorporated on one end side of the connector exterior and in which a light emission portion or a light incident portion is mounted toward the other end side of the connector exterior, in which the light emission portion or the light incident portion is mounted on the block so that an optical axis direction of the light emission portion or the light incident portion is tilted relative to a longitudinal direction of the connector exterior, and the light incident portion is a light receiving element configured to convert an optical signal into an electric signal.

(12) An optical connector includes:

a tubular connector exterior; and a block that is incorporated on one end side of the connector exterior and in which a light emission portion or a light incident portion is mounted toward the other end side of the connector exterior, in which the light emission portion or the light incident portion is mounted on the block so that an optical axis direction of the light emission portion or the light incident portion is tilted relative to a longitudinal direction of the connector exterior, the light emission portion is a light emitting element configured to convert an electric signal into an optical signal, and part of light emitted from the light emitting element is incident on a light diffusion portion provided inside the connector exterior.

(13) An optical connector includes:

a tubular connector exterior; and a block that is incorporated on one end side of the connector exterior and in which a light emission portion or a light incident portion is mounted toward the other end side of the connector exterior, in which the light emission portion or the light incident portion is mounted on the block so that an optical axis direction of the light emission portion or the light incident portion is tilted relative to a longitudinal direction of the connector exterior, and the light incident portion inputs light in accordance with incident light to a light transmission path.

(14) The optical connector according to (13), in which the block includes a lens through which the incident light is condensed.

(15) The optical connector according to (13) or (14), in which the block includes a light direction change member configured to change the direction of light in accordance with the incident light to the direction of the light transmission path extending in the longitudinal direction of the connector exterior.

(16) An optical connector including:

a tubular connector exterior;

a block that is incorporated on one end side of the connector exterior and in which a light emission portion or a light incident portion is mounted toward the other end side of the connector exterior; and a mirror structural body disposed on the other end side of the block and configured to change the direction of light emitted from the light emission portion to a direction tilted relative to a longitudinal direction of the connector exterior or change the direction of light from a direction tilted relative to the longitudinal direction of the connector exterior to the longitudinal direction of the connector exterior so that the light is incident on the light incident portion.

(17) The optical connector according to (16), in which the light emission portion emits collimated light in accordance with light output from a light transmission path, and at least part of collimated light reflected by the mirror structural body is incident on a light diffusion portion provided inside the connector exterior.

(18) The optical connector according to (17), in which the block includes a lens through which the collimated light is emitted.

(19) The optical connector according to (16), in which the light incident portion inputs light in accordance with incident collimated light to a light transmission path.

(20) The optical connector according to (19), in which the block includes a lens through which the incident collimated light is condensed.

(21) An optical cable including an optical connector as a plug, in which the optical connector includes:

a tubular connector exterior; and a block that is incorporated on one end side of the connector exterior and in which a light emission portion or a light incident portion is mounted toward the other end side of the connector exterior, the light emission portion or the light incident portion is mounted on the block so that an optical axis direction of the light emission portion or the light incident portion is tilted relative to a longitudinal direction of the connector exterior, the light emission portion emits collimated light in accordance with light output from a light transmission path, and at least part of the emitted collimated light is incident on a light diffusion portion provided inside the connector exterior.

(22) An electronic device including an optical connector as a receptacle, in which the optical connector includes:

a tubular connector exterior; and a block that is incorporated on one end side of the connector exterior and in which a light emission portion or a light incident portion is mounted toward the other end side of the connector exterior, the light emission portion or the light incident portion is mounted on the block so that an optical axis direction of the light emission portion or the light incident portion is tilted relative to a longitudinal direction of the connector exterior, the light emission portion emits collimated light in accordance with light output from a light transmission path, and at least part of the emitted collimated light is incident on a light diffusion portion provided inside the connector exterior.

(23) An optical cable including an optical connector as a plug, in which the optical connector includes:

a tubular connector exterior; and a block that is incorporated on one end side of the connector exterior and in which a light emission portion or a light incident portion is mounted toward the other end side of the connector exterior, the light emission portion or the light incident portion is mounted on the block so that an optical axis direction of the light emission portion or the light incident portion is tilted relative to a longitudinal direction of the connector exterior, the light emission portion emits light condensed in accordance with light output from a light transmission path, and at least part of the emitted light is incident on a light diffusion portion provided inside the connector exterior.

(24) An electronic device including an optical connector as a receptacle, in which the optical connector includes:

a tubular connector exterior; and a block that is incorporated on one end side of the connector exterior and in which a light emission portion or a light incident portion is mounted toward the other end side of the connector exterior, the light emission portion or the light incident portion is mounted on the block so that an optical axis direction of the light emission portion or the light incident portion is tilted relative to a longitudinal direction of the connector exterior, the light emission portion emits light condensed in accordance with light output from a light transmission path, and at least part of the emitted light is incident on a light diffusion portion provided inside the connector exterior.

(25) An optical cable including an optical connector as a plug, in which the optical connector includes:

a tubular connector exterior; and a block that is incorporated on one end side of the connector exterior and in which a light emission portion or a light incident portion is mounted toward the other end side of the connector exterior, the light emission portion or the light incident portion is mounted on the block so that an optical axis direction of the light emission portion or the light incident portion is tilted relative to a longitudinal direction of the connector exterior, the light emission portion is a light emitting element configured to convert an electric signal into an optical signal, and part of light emitted from the light emitting element is incident on a light diffusion portion provided inside the connector exterior.

(26) An electronic device including an optical connector as a receptacle, in which the optical connector includes:

a tubular connector exterior; and a block that is incorporated on one end side of the connector exterior and in which a light emission portion or a light incident portion is mounted toward the other end side of the connector exterior, the light emission portion or the light incident portion is mounted on the block so that an optical axis direction of the light emission portion or the light incident portion is tilted relative to a longitudinal direction of the connector exterior, the light emission portion is a light emitting element configured to convert an electric signal into an optical signal, and part of light emitted from the light emitting element is incident on a light diffusion portion provided inside the connector exterior.

(27) An optical cable including an optical connector as a plug, in which the optical connector includes:

a tubular connector exterior;

a block that is incorporated on one end side of the connector exterior and in which a light emission portion or a light incident portion is mounted toward the other end side of the connector exterior; and a mirror structural body disposed on the other end side of the block and configured to change the direction of light emitted from the light emission portion to a direction tilted relative to a longitudinal direction of the connector exterior or change the direction of light from a direction tilted relative to the longitudinal direction of the connector exterior to the longitudinal direction of the connector exterior so that the light is incident on the light incident portion.

(28) An electronic device including an optical connector as a receptacle, in which the optical connector includes:

a tubular connector exterior;

a block that is incorporated on one end side of the connector exterior and in which a light emission portion or a light incident portion is mounted toward the other end side of the connector exterior; and a mirror structural body disposed on the other end side of the block and configured to change the direction of light emitted from the light emission portion to a direction tilted relative to a longitudinal direction of the connector exterior or change the direction of light from a direction tilted relative to the longitudinal direction of the connector exterior to the longitudinal direction of the connector exterior so that the light is incident on the light incident portion.

REFERENCE SIGNS LIST

10A, 10B, 20A, 20B, 30A, 30B, 40A, 40B Optical connector
11A, 11B, 21A, 21B, 31A, 41B Connector exterior
12A, 12B, 22A, 22B, 32A, 42B Block
33A, 43B Mirror structural body
100 Electronic device
110 Transmission-reception unit
111A, 111B, 211A, 211B, 311A, 411B Light diffusion portion
120 Transmission unit
130 Reception unit
121A, 121B, 221B, 321A, 421B Lens
122A, 122B Maintaining portion
123B Regulative protrusion
124B Regulative recess
1111A Lock groove
1111B Lock spring
2022B Spring
200 Optical cable
201 Optical cable body
202A.202B Light transmission path
202A' Electricity transmission path
203A Light waveguide
204A Mirror structural body
221A Optical element
901 CPU
907 Host bus
909 Bridge
911 External bus
913 Interface
915 Input device
917 Output device
919 Storage device
921 Drive
923 Connection port
925 Communication device
927 Removable recording medium
929 External connection instrument
931 Communication network
7000 Vehicle control system
7010 Communication network
7100 Drive system control unit
7110 Vehicle state detection unit
7200 Body system control unit
7300 Battery control unit
7310 Secondary battery
7400 Vehicle exterior information detection unit
7410 Image capturing unit
7420 Vehicle exterior information detection section
7500 Vehicle interior information detection unit
7510 Driver state detection unit
7600 Integration control unit
7610 Micro computer
7640 Positioning unit
7650 Beacon reception unit
7670 Voice image output unit

7690 Storage unit
7710 Audio speaker
7720 Display unit
7730 Instrument panel
7750 External environment
7760 Vehicle interior instrument
7800 Input unit
7900 Vehicle
7910, 7912, 7914, 7916, 7918 Image capturing unit
7920, 7922, 7924, 7926, 7928, 7930 Vehicle exterior information detection section

The invention claimed is:

1. An optical connector, comprising:
a tubular connector exterior; and
a first block at a first end side of the tubular connector exterior, wherein
the first block comprises at least one of a light emission portion or a light incident portion that is mounted toward a second end side of the tubular connector exterior,
the second end side of the tubular connector exterior is opposite to the first end side of the tubular connector exterior,
the at least one of the light emission portion or the light incident portion is mounted on the first block so that an optical axis direction of the at least one of the light emission portion or the light incident portion is at an oblique angle relative to a longitudinal direction of the tubular connector exterior,
the light emission portion is configured to emit collimated light based on light output from a light transmission path, and
at least part of the emitted collimated light is incident on a light diffusion portion provided inside the tubular connector exterior.

2. The optical connector according to claim 1, wherein the first block includes a lens through which the collimated light is emitted.

3. The optical connector according to claim 1, wherein the first block includes a light direction change member configured to change, to a direction of the the oblique angle, a direction of light output from the light transmission path that extends in the longitudinal direction of the tubular connector exterior.

4. The optical connector according to claim 1, wherein the first block comprises a maintaining portion configured to contact a second block of a mating connector to maintain a block interval at a distance.

5. An optical connector, comprising:
a tubular connector exterior; and
a block at a first end side of the tubular connector exterior, wherein
the block comprises at least one of a light emission portion or a light incident portion that is mounted toward a second end side of the tubular connector exterior,
the second end side of the tubular connector exterior is opposite to the first end side of the tubular connector exterior,
the at least one of the light emission portion or the light incident portion is mounted on the block so that an optical axis direction of the at least one of the light emission portion or the light incident portion is at an oblique angle relative to a longitudinal direction of the tubular connector exterior, and
the light incident portion is configured to input light based on incident collimated light to a light transmission path.

6. The optical connector according to claim 5, wherein the block includes a lens through which the incident collimated light is condensed.

7. The optical connector according to claim 5, wherein the block includes a light direction change member configured to change a direction of the light based on the incident collimated light to a direction of a light transmission path that extends in the longitudinal direction of the tubular connector exterior.

8. An optical connector, comprising:
a tubular connector exterior; and
a block at a first end side of the tubular connector exterior, wherein
the block comprises at least one of a light emission portion or a light incident portion that is mounted toward a second end side of the tubular connector exterior,
the second end side of the tubular connector exterior is opposite to the first end side of the tubular connector exterior,
the at least one of the light emission portion or the light incident portion is mounted on the block so that an optical axis direction of the at least one of the light emission portion or the light incident portion at an oblique angle relative to a longitudinal direction of the tubular connector exterior,
the light emission portion is configured to emit light that is condensed based on light output from a light transmission path, and
at least part of the emitted light is incident on a light diffusion portion provided inside the tubular connector exterior.

9. The optical connector according to claim 8, wherein the block includes a lens through which the condensed light is emitted.

10. The optical connector according to claim 8, wherein the block includes a light direction change member configured to change, to a direction of the the oblique angle, a direction of light output from the light transmission path that extends in the longitudinal direction of the tubular connector exterior.

11. An optical connector, comprising:
a tubular connector exterior; and
a block at a first end side of the tubular connector exterior, wherein
the block comprises at least one of a light emission portion or a light incident portion that is mounted toward a second end side of the tubular connector exterior,
the second end side of the tubular connector exterior is opposite to the first end side of the tubular connector exterior,
the at least one of the light emission portion or the light incident portion is mounted on the block so that an optical axis direction of the at least one of the light emission portion or the light incident portion is at an oblique angle relative to a longitudinal direction of the tubular connector exterior, and
the light incident portion is a light receiving element configured to convert an optical signal into an electric signal.

12. An optical connector, comprising:

a tubular connector exterior; and a block at a first end side of the tubular connector exterior, wherein the block comprises at least one of a light emission portion or a light incident portion that is mounted toward a second end side of the tubular connector exterior, wherein the second end side of the tubular connector exterior is opposite to the first end side of the tubular connector exterior, the at least one of the light emission portion or the light incident portion is mounted on the block so that an optical axis direction of the at least one of the light emission portion or the light incident portion is at an oblique angle relative to a longitudinal direction of the tubular connector exterior, the light emission portion is a light emitting element configured to convert an electric signal into an optical signal, and part of light emitted from the light emitting element is incident on a light diffusion portion provided inside the tubular connector exterior.

13. An optical connector, comprising:

a tubular connector exterior; and a block at a first end side of the tubular connector exterior, wherein the block comprises at least one of a light emission portion or a light incident portion that is mounted toward a second end side of the tubular connector exterior, the second end side of the tubular connector exterior is opposite to the first end side of the tubular connector exterior, the at least one of the light emission portion or the light incident portion is mounted on the block so that an optical axis direction of the at least one of the light emission portion or the light incident portion is at an oblique angle relative to a longitudinal direction of the tubular connector exterior, and the light incident portion is configured to input light based on incident light to a light transmission path.

14. The optical connector according to claim 13, wherein the block includes a lens through which the incident light is condensed.

15. The optical connector according to claim 13, wherein the block includes a light direction change member configured to change a direction of light based on the incident light to a direction of a light transmission path that extends in the longitudinal direction of the tubular connector exterior.

16. An optical connector, comprising:

a tubular connector exterior;

a block at a first end side of the tubular connector exterior, wherein the block comprises at least one of a light emission portion or a light incident portion that is mounted toward a second end side of the tubular connector exterior; and a mirror structural body disposed on the other on the second end side of the block, wherein the mirror structural body is configured to change a direction of light emitted from the light emission portion to a direction tilted at an oblique angle relative to a longitudinal direction of the tubular connector exterior or change the direction of the light from the direction tilted at the oblique angle relative to the longitudinal direction of the tubular connector exterior to the longitudinal direction of the tubular connector exterior so that the light is incident on the light incident portion.

17. The optical connector according to claim 16, wherein the light emission portion is configured to emit collimated light based on the light output from a light transmission path, wherein at least part of the collimated light reflected by the mirror structural body is incident on a light diffusion portion provided inside the tubular connector exterior.

18. The optical connector according to claim 17, wherein the block includes a lens through which the collimated light is emitted.

19. The optical connector according to claim 16, wherein the light incident portion is configured to input the light based on incident collimated light to a light transmission path.

20. The optical connector according to claim 19, wherein the block includes a lens through which the incident collimated light is condensed.

21. An optical cable, comprising:

an optical connector as a plug, wherein the optical connector includes:

a tubular connector exterior; and a block at a first end side of the tubular connector exterior, wherein the block comprises at least one of a light emission portion or a light incident portion that is mounted toward a second end side of the tubular connector exterior, and the second end side of the tubular connector exterior is opposite to the first end side of the tubular connector exterior, the at least one of the light emission portion or the light incident portion is mounted on the block so that an optical axis direction of the at least one of the light emission portion or the light incident portion is at an oblique angle relative to a longitudinal direction of the tubular connector exterior, the light emission portion is configured to emit collimated light based on light output from a light transmission path, and at least part of the emitted collimated light is incident on a light diffusion portion provided inside the tubular connector exterior.

22. An electronic device, comprising:

an optical connector as a receptacle, wherein the optical connector includes:

a tubular connector exterior; and a block at a first end side of the tubular connector exterior, wherein the block comprises at least one of a light emission portion or a light incident portion that is mounted toward a second end side of the tubular connector exterior, and the second end side of the tubular connector exterior is opposite to the first end side of the tubular connector exterior, the at least one of the light emission portion or the light incident portion is mounted on the block so that an optical axis direction of the at least one of the light emission portion or the light incident portion is at an oblique angle relative to a longitudinal direction of the tubular connector exterior, the light emission portion is configured to emit collimated light based on light output from a light transmission path, and at least part of the emitted collimated light is incident on a light diffusion portion provided inside the tubular connector exterior.

23. An optical cable, comprising:

an optical connector as a plug, wherein the optical connector includes:

a tubular connector exterior; and a block at a first end side of the tubular connector exterior, wherein the block comprises at least one of a light emission portion or a light incident portion that is mounted toward a second end side of the tubular connector exterior, and the second end side of the tubular connector exterior is opposite to the first end side of the tubular connector exterior, the at least one of the light emission portion or the light incident portion is mounted on the block so that an optical axis direction of the at least one of the light emission portion or the light incident portion is at an oblique angle relative to a longitudinal direction of the tubular connector exterior, the light emission portion is configured to emit light that is condensed based on light output from a light transmission path, and at least part of the emitted light is incident on a light diffusion portion provided inside the tubular connector exterior.

24. An electronic device, comprising:

an optical connector as a receptacle, wherein the optical connector includes:

a tubular connector exterior; and a block at a first end side of the tubular connector exterior, wherein the block comprises at least one of a light emission portion or a light incident portion that is mounted toward a second end side of the tubular connector exterior, and the second end side of the tubular connector exterior is opposite to the first end side of the tubular connector exterior, the at least one of the light emission portion or the light incident portion is mounted on the block so that an optical axis direction of the at least one of the light emission portion or the light incident portion is at an oblique angle relative to a longitudinal direction of the tubular connector exterior, the light emission portion is configured to emit light that is condensed based on light output from a light transmission path, and at least part of the emitted light is incident on a light diffusion portion provided inside the tubular connector exterior.

25. An optical cable, comprising:

an optical connector as a plug, wherein the optical connector includes:

a tubular connector exterior; and a block at a first end side of the tubular connector exterior, wherein the block comprises at least one of a light emission portion or a light incident portion that is mounted toward a second end side of the tubular connector exterior, and the second end side of the tubular connector exterior is opposite to the first end side of the tubular connector exterior, the at least one of the light emission portion or the light incident portion is mounted on the block so that an optical axis direction of the at least one of the light emission portion or the light incident portion at an oblique angle relative to a longitudinal direction of the tubular connector exterior, the light emission portion is a light emitting element configured to convert an electric signal into an optical signal, and part of light emitted from the light emitting element is incident on a light diffusion portion provided inside the tubular connector exterior.

26. An electronic device, comprising:

an optical connector as a receptacle, wherein the optical connector includes:

a tubular connector exterior; and a block at a first end side of the tubular connector exterior, wherein the block comprises at least one of a light emission portion or a light incident portion that is mounted toward a second end side of the tubular connector exterior, the second end side of the tubular connector exterior is opposite to the first end side of the tubular connector exterior, the at least one of the light emission portion or the light incident portion is mounted on the block so that an optical axis direction of the at least one of the light emission portion or the light incident portion is at an oblique angle relative to a longitudinal direction of the tubular connector exterior, the light emission portion is a light emitting element configured to convert an electric signal into an optical signal, and part of light emitted from the light emitting element is incident on a light diffusion portion provided inside the tubular connector exterior.

27. An optical cable, comprising:

an optical connector as a plug, wherein the optical connector includes:

a tubular connector exterior;

a block at a first end side of the tubular connector exterior, wherein the block comprises at least one of a light emission portion or a light incident portion that is mounted toward a second end side of the tubular connector exterior, and the second end side of the tubular connector exterior is opposite to the first end side of the tubular connector exterior; and a mirror structural body on the second end side of the block, wherein the mirror structural body is configured to change a direction of light emitted from the light emission portion to a direction at an oblique angle relative to a longitudinal direction of the tubular connector exterior or change the direction of the light from the direction at the oblique angle relative to the longitudinal direction of the tubular connector exterior to the longitudinal direction of the tubular connector exterior so that the light is incident on the light incident portion.

28. An electronic device, comprising:

an optical connector as a receptacle, wherein the optical connector includes:

a tubular connector exterior;

a block at a first end side of the tubular connector exterior, wherein the block comprises at least one of a light emission portion or a light incident portion that is mounted toward a second end side of the tubular connector exterior, and the second end side of the tubular connector exterior is opposite to the first end side of the tubular connector exterior; and a mirror structural body on the second end side of the block, wherein the mirror structural body is configured to change a direction of light emitted from the light emission portion to a direction at an oblique angle relative to a longitudinal direction of the tubular connector exterior or change the direction of the light from the direction at the oblique angle relative to the longitudinal direction of the tubular connector exterior to the longitudinal direction of the tubular connector exterior so that the light is incident on the light incident portion.

* * * * *